US008537178B2

(12) United States Patent
Goto et al.

(10) Patent No.: US 8,537,178 B2
(45) Date of Patent: Sep. 17, 2013

(54) WAVEFORM OBSERVING APPARATUS AND WAVEFORM OBSERVING SYSTEM

(75) Inventors: Naoki Goto, Osaka (JP); Yohei Okawa, Osaka (JP)

(73) Assignee: Keyence Corporation, Osaka (JP)

( * ) Notice: Subject to any disclaimer, the term of this patent is extended or adjusted under 35 U.S.C. 154(b) by 1099 days.

(21) Appl. No.: 12/502,362

(22) Filed: Jul. 14, 2009

(65) Prior Publication Data
US 2010/0026713 A1 Feb. 4, 2010

(30) Foreign Application Priority Data
Aug. 4, 2008 (JP) .................... 2008-200852

(51) Int. Cl.
*G09G 5/00* (2006.01)
*G09G 5/22* (2006.01)
*G06T 11/20* (2006.01)

(52) U.S. Cl.
USPC ......... 345/660; 345/440; 345/440.1; 345/629

(58) Field of Classification Search
USPC ............... 345/440, 440.1, 629, 660
See application file for complete search history.

(56) References Cited

U.S. PATENT DOCUMENTS

| 6,088,481 A * | 7/2000 | Okamoto et al. ............ 382/189 |
| 2008/0180460 A1 * | 7/2008 | Ford .............................. 345/661 |
| 2009/0063948 A1 * | 3/2009 | Finn et al. ..................... 715/230 |
| 2009/0307618 A1 * | 12/2009 | Lawler et al. ................ 715/764 |
| 2010/0005008 A1 * | 1/2010 | Duncker et al. ............... 705/27 |

FOREIGN PATENT DOCUMENTS
JP 07-114349 5/1995
JP 2002-082133 3/2002

* cited by examiner

*Primary Examiner* — Jeffrey Chow
(74) *Attorney, Agent, or Firm* — Kilyk & Bowersox, P.L.L.C.

(57) ABSTRACT

There are provided a waveform observing apparatus and waveform observing system that solve a problem of displacement of a handwritten comment which occurs with enlargement/reduction in display in such a manner that, when a determination is NO in a process step, namely when a current compression ratio differs from a compression ratio at the time of writing a handwritten comment in displaying the handwritten comment to such a degree as to cause occurrence of non-allowable displacement, a process proceeds to a next process step, and a simple indication indicating the presence of the handwritten comment is displayed in a position associated with a portion of a waveform corresponding to a measured data number.

18 Claims, 29 Drawing Sheets

FIG. 8

| Sampling cycle | Time/Div | | | | | | | | | | | | | | |
|---|---|---|---|---|---|---|---|---|---|---|---|---|---|---|---|
| | 15s | 30s | 1min | 2min | 5min | 10min | 15min | 30min | 1h | 2h | 5h | 10h | 30h | 5day | 10day |
| 10ms | 50 | 100 | 200 | 400 | 1000 | 2000 | 3000 | ⋮ | ⋮ | ⋮ | ⋮ | ⋮ | ⋮ | 1440000 | 2880000 |
| 20ms | 25 | 50 | 100 | 200 | 500 | 1000 | 1500 | ⋮ | ⋮ | ⋮ | ⋮ | ⋮ | ⋮ | 720000 | 1440000 |
| 50ms | 10 | 20 | ⋮ | ⋮ | 200 | ⋮ | 600 | ⋮ | ⋮ | ⋮ | ⋮ | ⋮ | ⋮ | ⋮ | 576000 |
| 100ms | 5 | 10 | 20 | ⋮ | 100 | 200 | 300 | 600 | ⋮ | ⋮ | 2400 | 12000 | ⋮ | ⋮ | 288000 |
| 200ms | ⋮ | 5 | 10 | 20 | 50 | 100 | 150 | 300 | 600 | ⋮ | 1200 | 6000 | ⋮ | 72000 | 144000 |
| 500ms | × | 2 | 4 | 8 | 20 | ⋮ | 60 | 120 | 240 | 600 | ⋮ | ⋮ | 7200 | ⋮ | 57600 |
| 1s | × | 1 | 2 | 4 | 10 | ⋮ | 30 | 60 | 120 | 240 | ⋮ | 600 | 3600 | ⋮ | 28800 |
| 2s | × | × | 1 | 2 | 5 | 10 | 15 | ⋮ | ⋮ | 120 | ⋮ | ⋮ | ⋮ | 7200 | 14400 |
| 5s | × | × | × | × | 2 | 4 | 6 | ⋮ | ⋮ | 48 | 120 | 240 | ⋮ | 3600 | 5760 |
| 10s | × | × | × | × | 1 | 2 | 3 | ⋮ | 12 | ⋮ | 48 | 60 | 360 | ⋮ | 2880 |
| 20s | × | × | × | × | × | 1 | × | ⋮ | 6 | 12 | ⋮ | 30 | 180 | 720 | 1440 |
| 30s | × | × | × | × | × | × | × | 2 | 4 | 8 | ⋮ | 20 | ⋮ | 480 | 960 |
| 1min | × | × | × | × | × | × | × | 1 | 2 | 4 | ⋮ | 10 | 30 | ⋮ | 480 |
| 2min | × | × | × | × | × | × | × | × | 1 | 2 | 4 | 5 | 10 | 30 | 240 |
| 5min | × | × | × | × | × | × | × | × | × | × | ⋮ | 2 | 4 | 12 | 96 |
| 10min | × | × | × | × | × | × | × | × | × | × | 2 | 1 | 2 | 6 | 48 |

FIG. 10

| What dot number out of entire display | Calculated measured data displayed in each dot | Measured data actually displayed in each dot | Compressed data | Measured data included in each display data |
|---|---|---|---|---|
| 1st dot | 1~1000 | 1~1200 | 1 | 1~300 |
| 2nd dot | 1000~2000 | 1201~2100 | 2 | 301~600 |
| 3rd dot | ... | 2101~3000 | 3 | 601~900 |
| 4th dot | ... | 3001~4200 | 4 | 901~1200 |
| 5th dot | ... | ... | 5 | 1201~1500 |
| 6th dot | ... | ... | 6 | 1501~1800 |
| 7th dot | ... | ... | 7 | 1801~2100 |
| 8th dot | ... | ... | 8 | ... |
| 9th dot | 8000~9000 | 8101~9100 | 9 | ... |
| | | | 10 | ... |
| | | | 11 | ... |
| | | | 12 | ... |
| | | | 13 | ... |
| | | | 14 | ... |
| | | | 15 | ... |
| | | | 16 | ... |
| | | | 17 | ... |
| | | | 18 | ... |
| | | | 19 | ... |
| | | | 20 | ... |
| | | | 21 | ... |
| | | | 22 | ... |
| | | | 23 | ... |
| | | | 24 | ... |
| | | | 25 | ... |
| | | | 26 | ... |
| | | | 27 | ... |
| | | | 28 | ... |
| | | | 29 | 8401~8700 |
| | | | 30 | 8701~9000 |

Creation of compressed-display data file

Display of waveform observing apparatus

PRIOR ART

WAVEFORM OBSERVING APPARATUS AND WAVEFORM OBSERVING SYSTEM

CROSS-REFERENCE TO RELATED APPLICATIONS

The present application claims foreign priority based on Japanese Patent Application No. 2008-200852, filed Aug. 4, 2008, the contents of which is incorporated herein by reference.

BACKGROUND OF THE INVENTION

1. Field of the Invention

The present invention relates to a waveform observing apparatus for displaying measured data in waveform on a display, and a waveform observing system including an external computer.

2. Description of the Background Art

There are known waveform observing apparatuses for storing measured data on temperature and pressure of equipment on a factory production line, and also displaying a waveform on a display, such as a logger, or displaying a potential difference in waveform, such as an oscilloscope. The measured data on temperatures and pressure historically used to be written in waveform on rolled paper (chart), but with the development of electronic equipment, a waveform observing apparatus that displays a waveform by use of a display in place of paper is currently in wide use.

The waveform observing apparatus is capable of displaying in a display section a constantly varying measured value, namely a time-series waveform, while storing measured data captured from a thermocouple or the like into a memory mounted to the waveform observing apparatus. For example, Japanese Patent Application Laid-Open No. H7-114349 and Japanese Patent Application Laid-Open No. 2002-82133 each disclose a waveform observing apparatus having a display with a touch panel. Japanese Patent Application Laid-Open No. H7-114349 proposes that, by a user touching a function key displayed in a display section, a function designated by the function key displayed in the display section is executed. Japanese Patent Application Laid-Open No. 2002-82133 displays that, while a displayed waveform is observed, an operation of inputting a comment or a marking by pen-input is performed using a pen-input touch screen.

There has been a request as the need for the waveform observing apparatus to rapidly enlarge and reduce a displayed waveform even when the waveform observing apparatus repeatedly stops and starts collection of measured data, while leaving measured data before stoppage on the screen of the display section. In the case of responding to this first request, it is desired that, when collection of measured data is once stopped and then resumed, a boundary between the stoppage and the resuming be seen in a display on the screen. Apart from this, however, there has been a problem in that displacement of a handwritten comment occurs with the enlargement and reduction.

This displacement is described with reference to FIG. 29. FIG. 29A shows a display state when a handwritten comment is written. FIG. 29B shows a display state when an enlarged display is made in a time-axial, namely lateral, direction. FIG. 29C shows a display state when a reduced display is made in the time-axial direction.

Further, in ordinary cases, editing and the like are performed using an external computer, and with a difference in number of pixels and size between the external computer and the display of the waveform observing apparatus, the foregoing problem of displacement of the handwritten comment is apt to occur.

SUMMARY OF THE INVENTION

An object of the present invention is to provide a waveform observing apparatus capable of solving the problem of displacement of a handwritten comment which occurs with enlargement and reduction in display.

Another object of the present invention is to provide a waveform observing apparatus capable of solving the problem of displacement between a displayed waveform and a handwritten comment in a case when measured data is edited using an external computer capable of making a waveform display.

According to a first aspect of the present invention, the above technical problems are solved by providing a waveform observing apparatus, including a touch panel in a display section and allowing a handwritten comment to be written in a desired place of a displayed waveform by use of the touch panel, the apparatus including:

a first image information generating device for generating first handwritten comment image information which includes a compression ratio of a waveform display at the time of writing the handwritten comment by use of the touch panel, along with first image information of the written handwritten comment;

a simple indication registering device for registering a simple indication for displaying a simple indication corresponding to the handwritten comment;

a memory device for storing the first handwritten comment image information and the registered simple indication;

a compression ratio setting device for setting a compression ratio of a waveform display of the waveform observing apparatus; and a control device, which calls up the first handwritten comment image information of the handwritten comment from the memory device and displays as superimposing the first image information on a waveform having a time-axial position where the handwritten comment should be displayed in the display section of the waveform observing apparatus on the occasion when the waveform is displayed in determination of a compression ratio set by the compression ratio setting device to be the same as the compression ratio at the time of writing the handwritten comment or to be a compression ratio in an allowable range for displacement of an image of the handwritten comment from the waveform on display in the waveform observing apparatus at the time of displaying the image, and also calls up the simple indication corresponding to the handwritten comment from the memory device and displays as superimposing the first image information on the waveform having a time-axial position where the handwritten comment should be displayed in the display section of the waveform observing apparatus on the occasion when the waveform is displayed in determination of the compression ratio set by the compression ratio setting device to be different from the compression ratio at the time of writing the handwritten comment or not to be the compression ratio in the allowable range for displacement of the image of the handwritten comment from the waveform on display in the waveform observing apparatus at the time of displaying the image.

Namely, in the waveform observing apparatus of the present invention, determining from a compression ratio of a display, when displacement does not occur, an image of a handwritten comment is drawn in a predetermined position.

On the other hand, when the displacement occurs, a simple indication in association with a waveform portion added with the handwritten comment is drawn in place of the handwritten comment so as to notify the user that it is the waveform portion added with the handwritten comment.

In a preferred embodiment further provided is a simple indication selecting device, with which a user can select a simple indication. By the user selecting the simple indication, the compression ratio of the displayed waveform is forcefully changed to display in waveform the compression ratio at the time of writing the handwritten comment, and also displays the handwritten comment in a predetermined position.

According to a second aspect of the present invention, the above technical problems are solved by providing a waveform observing system, including the waveform observing apparatus and an external computer capable of storing measured data collected by the waveform observing apparatus and displaying the measured data in waveform, wherein, along with the measured data collected by the waveform observing apparatus from the waveform observing apparatus, the simple indication, the first handwritten comment image information and second image information associated with the first handwritten comment image information are stored from the waveform observing apparatus into a memory of the external computer, the simple indication is displayed in the vicinity of a waveform portion added with the handwritten comment, along with the waveform display of the measured data, in the external computer, and by the user selecting the simple indication, based upon the second image information, an image of a partial waveform in the vicinity of the handwritten comment is displayed in the external computer, along with the handwritten comment.

According to this waveform observing system, when a waveform is displayed in an external computer, the user can be aware of the presence of the handwritten comment by looking at the simple indication of the portion added with the handwritten comment, and since the handwritten comment and an image of a partial waveform in the vicinity of the handwritten comment are displayed by selection of this simple indication, it is possible to solve the problem of displacement between the waveform display by use of the external computer and handwritten comment.

BRIEF DESCRIPTION OF THE DRAWINGS

FIG. 8 is a list as an exemplification representing the number of pieces of data required for drawing a display dot based upon the relation between the sampling cycle and the compression ratio;

FIG. 10 is a diagram for explaining creation of compressed data at a compression ratio after changed from a plurality of pieces of compressed data at the time when setting of the compression ratio is changed;

FIG. 29A shows a display at the time of writing the handwritten comment, FIG. 29B shows a display at the time of time-axially enlarging and displaying the waveform, and FIG. 29C is a display at the time of time-axially reducing and displaying the waveform.

DESCRIPTION OF THE PREFERRED EMBODIMENTS

Figure 1:
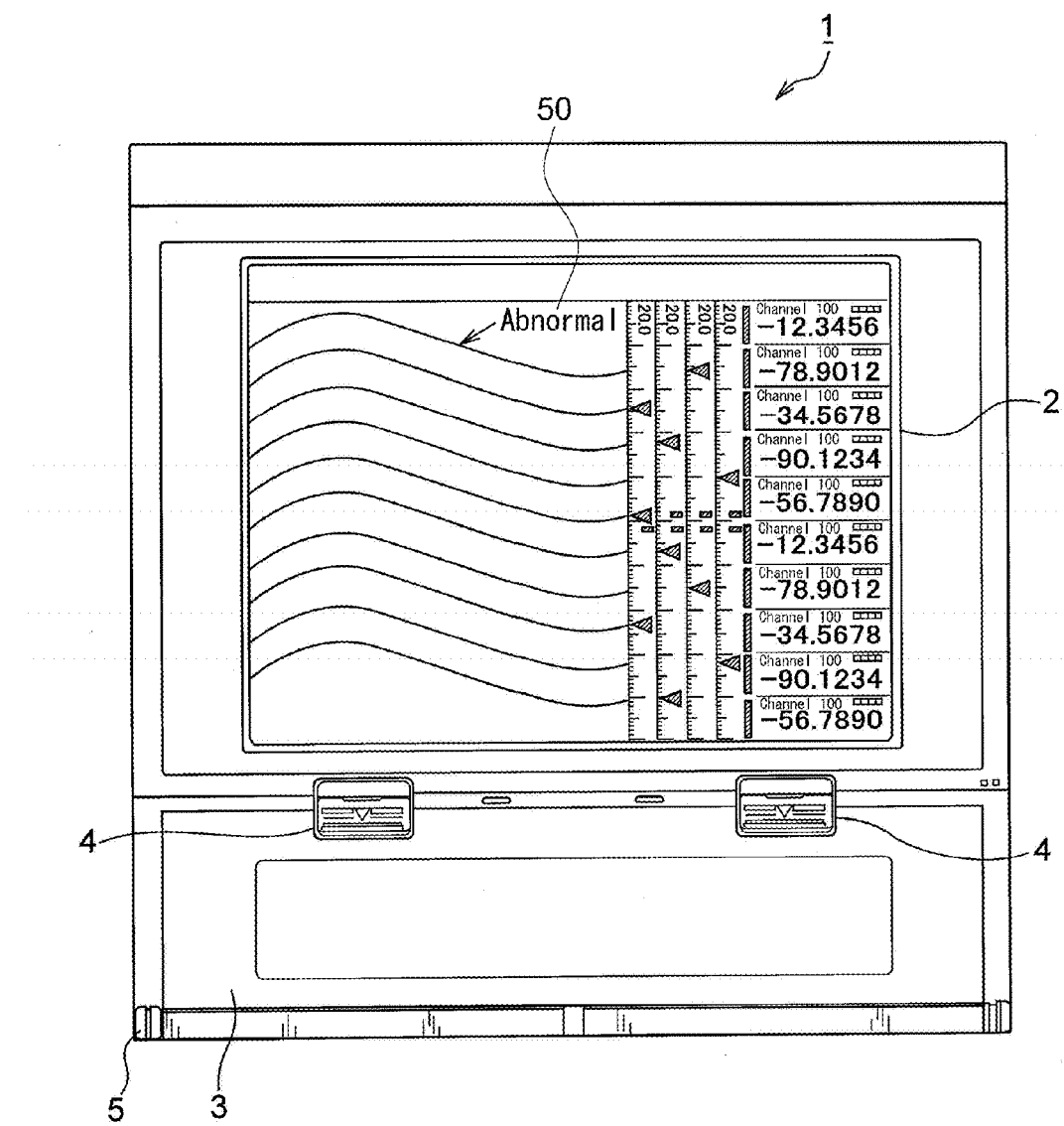
FIG. 1 is a front view of a waveform observing apparatus of an embodiment.
Figure 2:
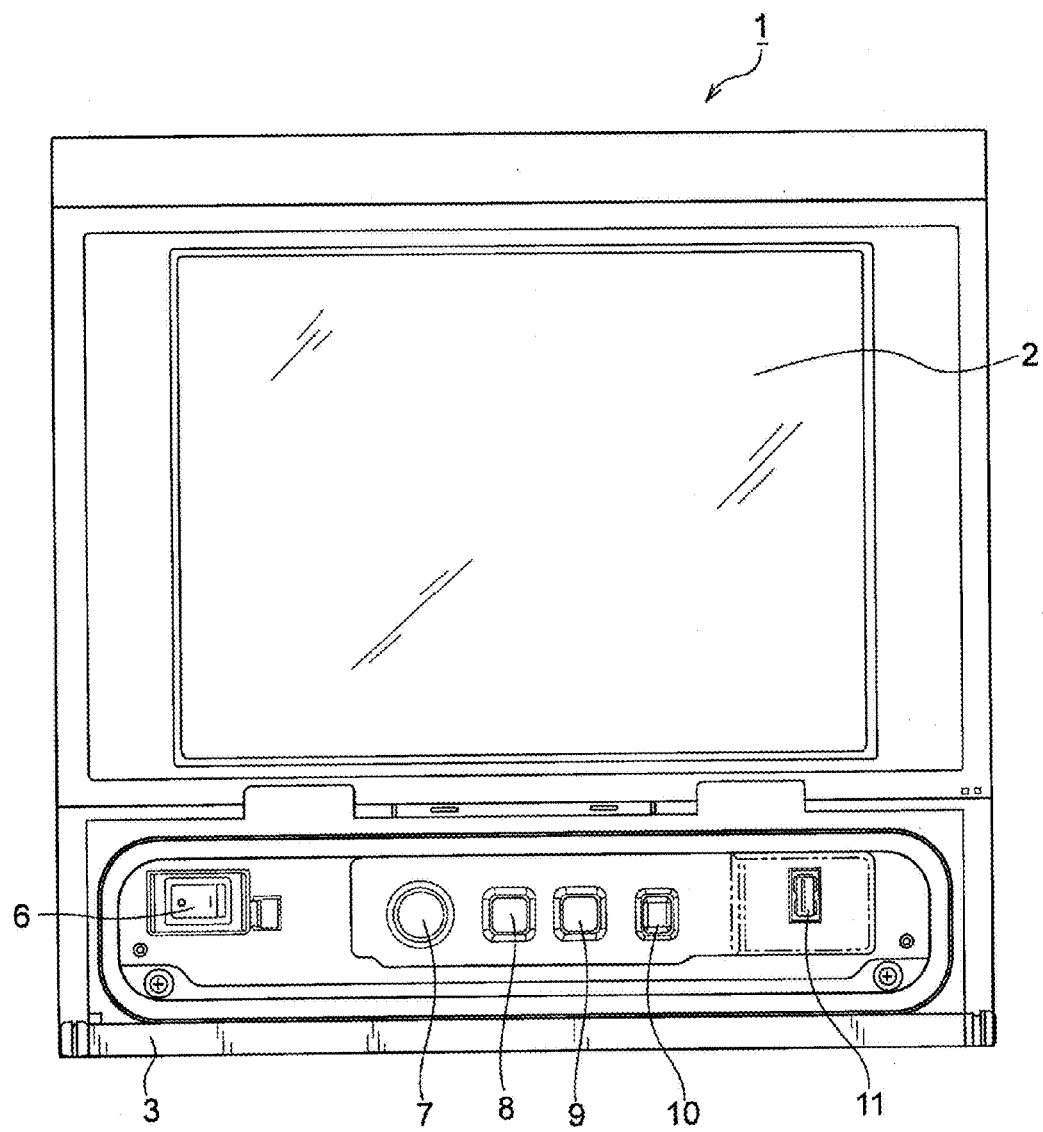
FIG. 2 is a front view of the waveform observing apparatus of the embodiment as in FIG. 1, as well as a view showing a state in which a waterproof cover provided under a display is open.

In the following, a preferred embodiment of the present invention is described with reference to attached drawings. FIG. 1 is a front view of a waveform observing apparatus 1 of an embodiment. The waveform observing apparatus 1 has a top-open waterproof cover 3 with a lower hinge below a display section 2, and the waterproof cover 3 can be opened with a lower hinge 5 at the center by releasing a slide lock 4. FIG. 2 shows a state where the waterproof cover 3 is opened. As seen from this FIG. 2, a main power switch 6, a start/stop switch button 7, a setting menu button 8, a user key button 9, a touch panel function lock switch button 10, and a USB connector 11 are exposed by opening the water proof 3.

Figure 3:
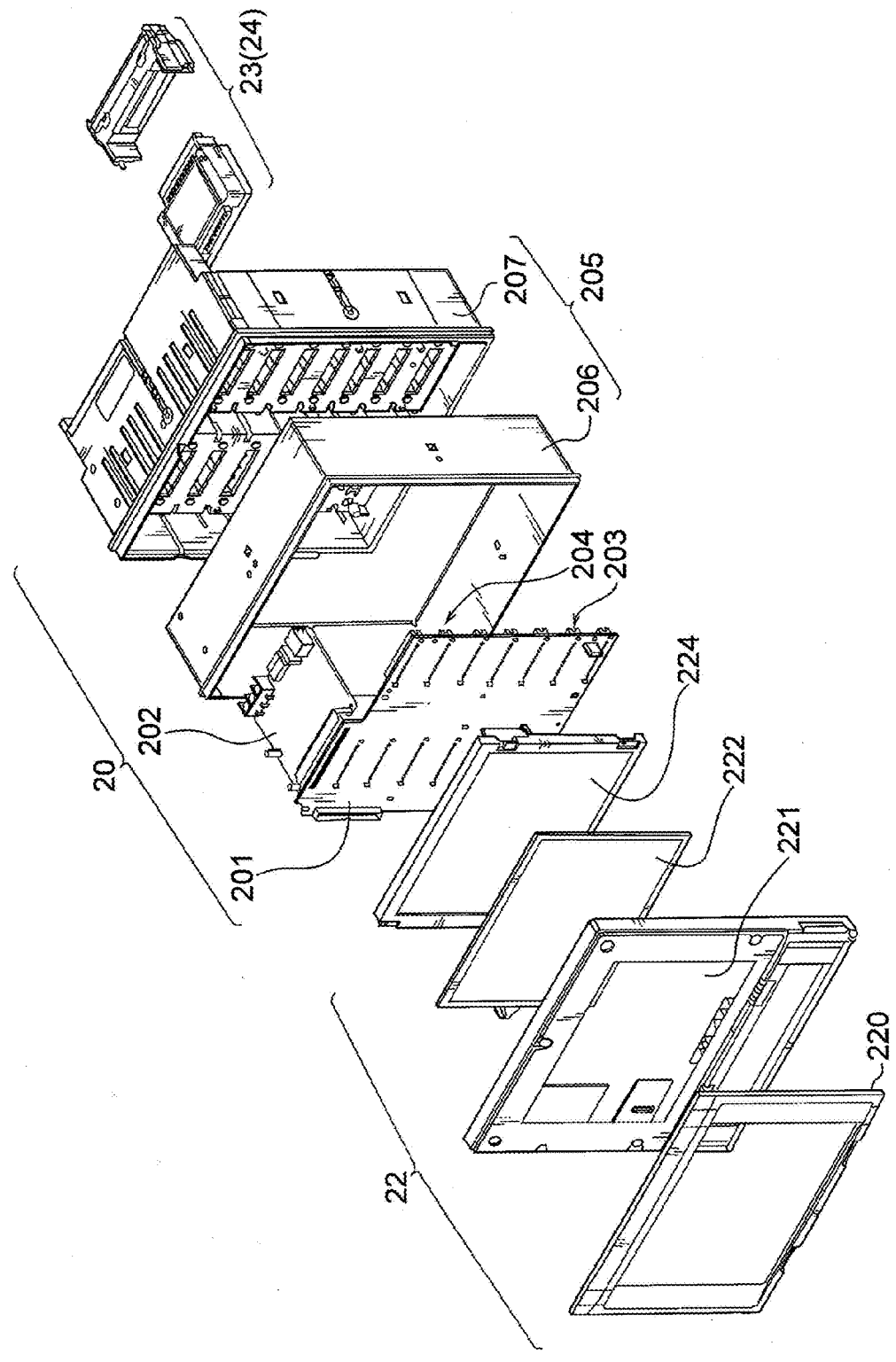
FIG. 3 is an exploded perspective view of the waveform observing apparatus of the embodiment.
Figure 4:
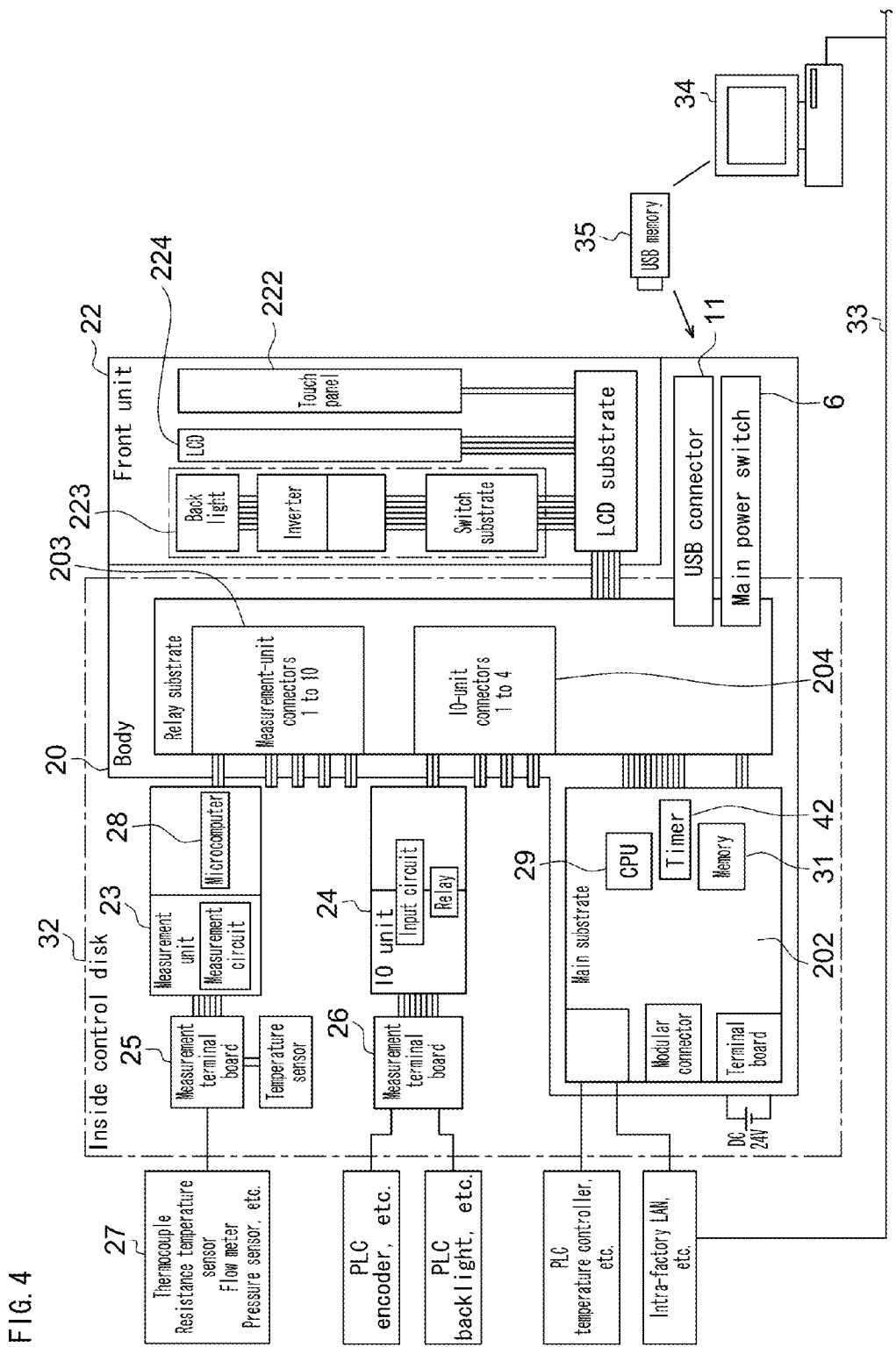
FIG. 4 is a block diagram of the waveform observing apparatus of the embodiment.

FIG. 3 is an exploded perspective view of the waveform observing apparatus 1, and FIG. 4 is a block diagram of the same. The waveform observing apparatus 1 has a body 20 and a detachable front unit 22 on the front surface of this body 20. The front unit 22 is made up of a cosmetic panel 220, a front surface frame 221, a touch panel 222, and a liquid display 224 having a back light 223 (FIG. 4). The touch panel 222 and the liquid display 224 with the back light constitute a slim-type display with a touch panel as the display section 2, and a waveform chart is displayed in the display section 2 as shown in the figure.

The body 20 has a relay substrate 201 located on its front surface in an erect state, and a main substrate 202 that is connected to the upper end of the relay substrate 201 and horizontally extends. The relay substrate 201 is installed with ten measurement-unit connectors 203 and four 10-unit connectors 204. The relay substrate 201 and the main substrate 202 are housed inside a body case 205.

The body case 205 is made up of a metal-made outer case 206 and an inner plastic case 207, and in the plastic case 207, multistage shelves in two right and left columns for housing measurement units 23 and IO units 24 are formed. The measurement unit 23 and the IO unit 24 can be connector-connected by being inserted into the shelves of the plastic case 207 from its rear side. Namely, the relay substrate 201 that is located in the erect state ahead of the plastic case 207 is installed with the connectors 203, 204 in positions associated with the respective shelves of the plastic case 207, and the measurement units 23 or the IO units 24 can be connector-connected by being inserted into the respective shelves of the plastic case 207. Adopting such a configuration can reduce the size of the waveform observing apparatus 1.

The measurement unit 23 and the IO unit 24 are respectively installed with terminal boards 25, 26 on the rear surfaces thereof (FIG. 4), and the terminal board 25 of the measurement unit 23 is wire-connected with a variety of sensors 27 such as a thermocouple, a resistance temperature sensor, a flow meter and a pressure sensor. Upon receipt of a signal from the sensor 27, an intra-unit microcomputer 28 communicates with a CPU 29 of the main substrate 202 through the relay substrate 201, and transmits measured data received from the sensor 27 to the main substrate 202.

The CPU 29 of the main substrate 202 performs signal processing in accordance with a predetermined program, to store the measured data into a body memory 31 in a predetermined cycle, and also generates an image signal for controlling drawing in the display section 2. The main substrate 202 and the display section 2 are connected with each other through the relay substrate 201. When the user touches the touch panel 222, a touched position signal, or a coordinate signal, corresponding to the touch is supplied from the touch panel 222 to the CPU 29 of the main substrate 202, and the CPU 29 realizes a function meant by a key corresponding to the touched place, or generates a signal for executing scroll of a waveform on display in the display section 2 based upon the coordinate signal.

The user can write a handwritten comment 50 (FIG. 1) by use of the touch panel 222 while looking at the waveform displayed on a liquid crystal display. This enables the use of the waveform observing apparatus 1 in much the same way as a comment is written on a conventional chart with a waveform written thereon.

The waveform observing apparatus 1 is installed into a control box 32 (FIG. 4) at the factory and can be connected to a personal computer 34 through an intra-factory LAN 33. The personal computer 34 can display the same waveform as the waveform on display in the waveform observing apparatus 1. Further, a copy of data stored in the body memory 31 of the waveform observing apparatus 1 can be retrieved by inserting the USB memory 35 as a removable recording medium into the USB connector 11.

Figure 5:
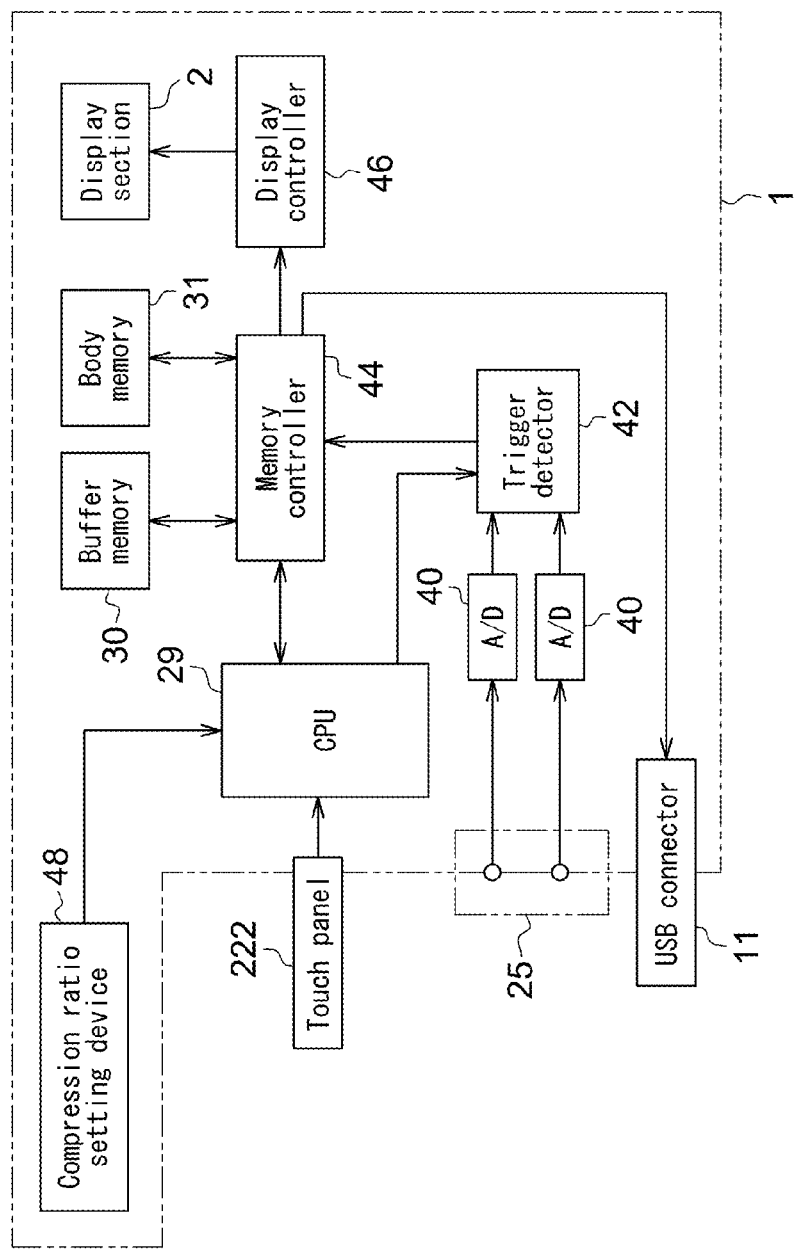
FIG. 5 is a block diagram where elements associated with reduction and display of a waveform in a display section of the waveform observing apparatus are extracted.

FIG. 5 is a block diagram of a portion associated with a waveform display and a handwritten comment written by use of the touch panel 222 in the display section 2. A measured data signal inputted from each of the variety of sensors 27 connected to the terminal board 25 is inputted into the microcomputer 28 through an A/D convertor 40 included in the measurement unit 23 (FIG. 4), and transmitted from the microcomputer 28 to the CPU 29 of the main substrate 202 in accordance with a predetermined sampling cycle selected by the user. Further, the handwritten comment inputted by handwriting on the touch panel 222 is transmitted through the CPU 29 so that handwritten comment information is created.

In the waveform observing apparatus 1, in accordance with trigger conditions settable by the user, such as a sampling cycle for capturing measured data, a variety of events or a rise, the measured data and the handwritten comment information are transmitted to the memory controller 44 through a trigger detector 42 and temporarily stored into the buffer memory 30. The measured data and the handwritten comment temporarily stored in the buffer memory 30 are then stored into the body memory 31 in the state of being filed in each predetermined file creation cycle. Further, the measured data is transmitted to a display controller 46 through the memory controller 44, and displayed in waveform in the display section 2, and a handwritten comment is drawn in a predetermined position.

Although FIG. 1 shows the waveform observing apparatus 1 in a state where waveforms are displayed in the display section 2, and the waveform displayed in the display section 2 can be time-axially reduced and displayed. For example, the user can select a waveform from a menu (compression ratio setting device 48) displayable in the display section 2, so as to set a compression ratio of the waveform display.

Figure 6:
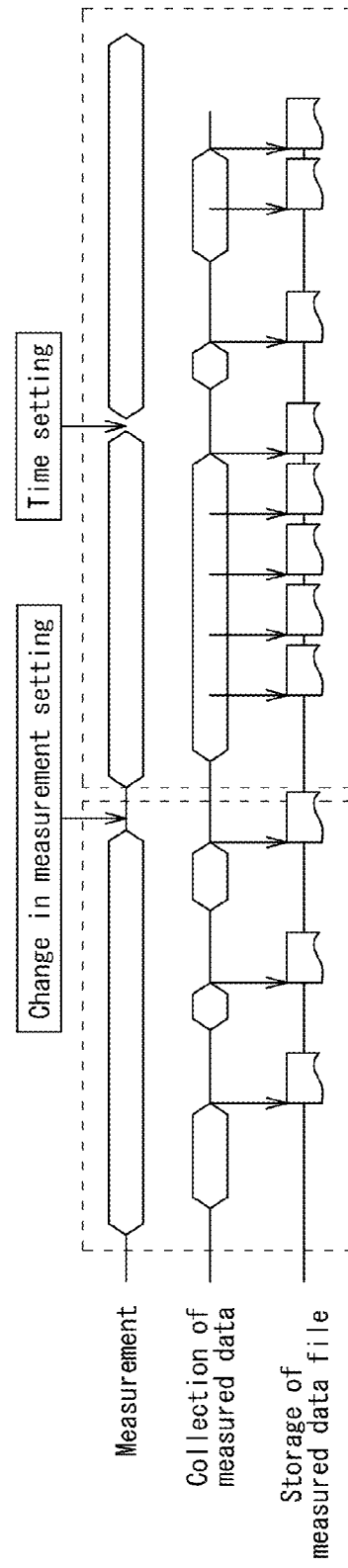
FIG. 6 is a diagram for explaining a series of processing for generation of information associated with a handwritten comment, along with filing of sampled measured data in a fixed file formation cycle.

A method for storing measured data and handwritten comment information in the waveform observing apparatus 1 of the embodiment is described with reference to FIGS. 6 and 7. Measured data and handwritten comment information are temporarily stored into the buffer memory 30 (FIG. 5). A measured data file is generated in the body memory 31 in each predetermined file creation cycle set by the user, and the measured data and the handwritten comment information in the buffer memory 30 are stored into this measured data file. When sampling is stopped or a measurement setting condition is changed, a file for measured data immediately before the stoppage for storing measured data and handwritten comment information, temporarily stored in the buffer memory 30 at that time, is generated in the body memory 31, and measured data and handwritten comment information which are not yet filed in the buffer memory 30 are housed into this file for measured data immediately before the stoppage. This file for measured data immediately before the stoppage corresponds to a file 004 in FIG. 7. This processing constitutes a device for processing measured data immediately before the stoppage.

After the setting change of the measurement condition, a new measured data file is generated in the body memory 31 in each predetermined file generation cycle. Naturally, a serial number is given to a file name of each measured data file. With the serial number included in the file name, it is possible to know a time series of each measured data file stored in the body memory 31.

As for compressed-display measured data in the display section 2, a compressed-data file for display is generated in the body memory 31 separately from the above-mentioned measured data file. A plurality of compressed-data files for display are prepared correspondingly to a plurality of compression ratios and sampling cycles which are settable by the user.

FIG. 8 is a list as an example for explaining the number of pieces of data required for drawing one display dot in combination of the sampling cycle and the compression ratio (Time/div.). It is found from FIG. 8 that, for example in the case of the sampling cycle being set to 100 ms and Time/div. being set to 15 minutes (min.), 300 pieces of measured data are required for drawing one display dot. Therefore, when this compression ratio is set, the maximum value and the minimum value of every 300 pieces of measured data are calculated as display data, which are stored as compressed data into the compressed-data file for display.

Figure 7:
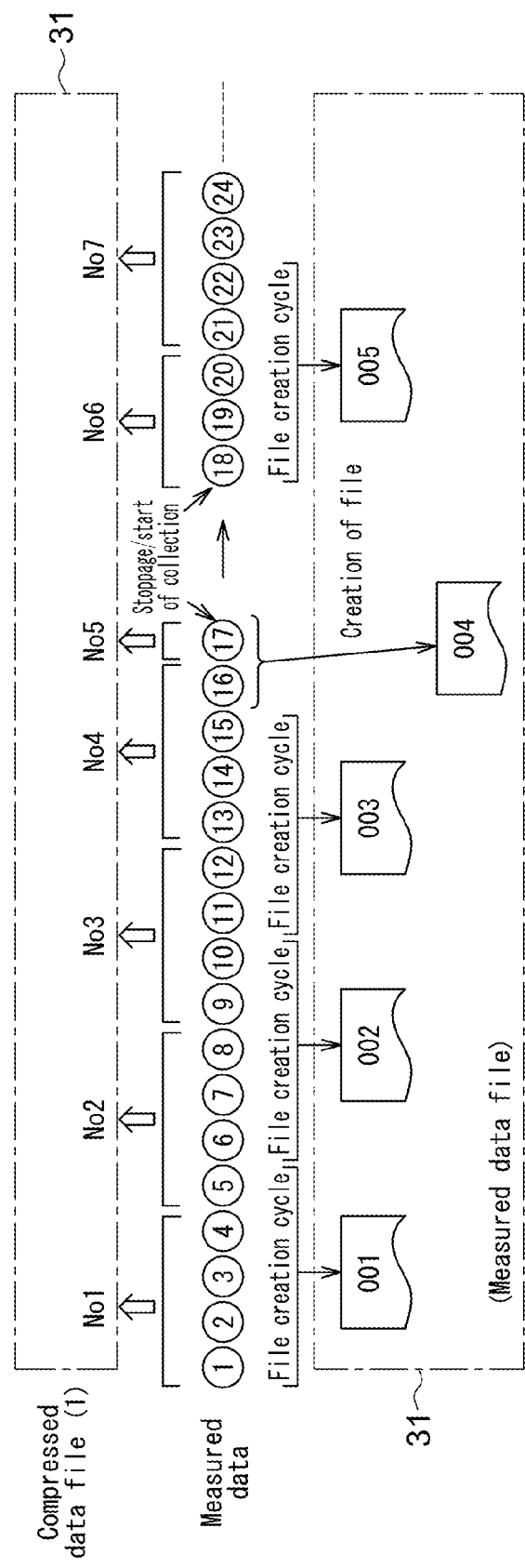
FIG. 7 is an explanatory view for explaining formation of compressed data at stoppage and immediately after sampling, along with creation of compressed data for a reduced display as well as measured-data filing.

Above FIG. 7 is a diagram for schematically explaining this. For example, when four pieces of measured data are required for drawing of one display dot, one compressed data is generated every time four measured data are stored in the buffer memory 30, and this compressed data is stored into the compressed-data file for display in the body memory 31. In the example of FIG. 7, when data collection is stopped, as for seventeenth measured data as a fraction of the buffer memory 30, fifth compressed data (final compressed data) regarding the seventeenth measured data is calculated and stored into the compressed-data file for display. Then, when the data collection is resumed, sixth compressed data (top compressed data) regarding three pieces of measured data, namely eighteenth to twentieth measured data, as the number of pieces of difference data is calculated and stored into the compressed-data file for display.

Figure 9:
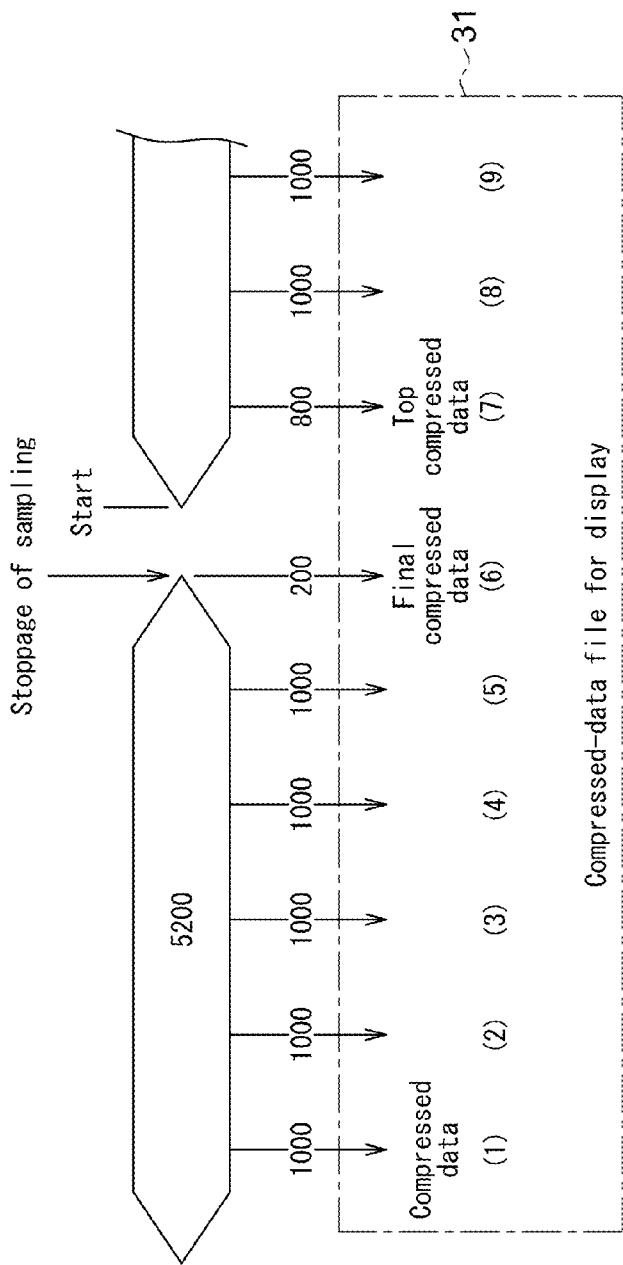
FIG. 9 is an explanatory diagram for explaining final compressed data at stoppage of sampling and top compressed data immediately after resuming of sampling.

FIG. 9 is a diagram for explaining the same as above, as well as a diagram regarding the case of a compression ratio requiring 1000 pieces of measured data for drawing one display dot. Every time 1000 pieces of compressed data are collected in the buffer memory 30, the maximum value and the minimum value thereof are calculated, and then stored as compressed data into the compressed data file, namely the compressed-data file for display. This is an example of sampling being stopped at the time of 5200 pieces of measured data. At the time when sampling is stopped, the number of pieces of data of a fraction is 200, and the maximum value and the minimum value in regard to the 200 pieces of the measured data of the fraction are calculated, and those values are stored into the compressed-data file for display as final compressed data (6). When sampling is resumed, at the time when 800 pieces of measured data are collected as data of a fraction, the maximum value and the minimum value thereof are calculated, and those values are stored into the compressed-data file for display as top compressed data (7). Subsequently, every time when 1000 pieces of measured data are collected, the maximum value and the minimum value thereof are calculated and then stored as compressed data into the compressed-data file for display.

As thus described, as compressed data in the compressed-data file, at the time of stopping the sampling, the final compressed data (6) is generated by use of measured data of a fraction which were collected immediately before the stoppage, and at the time of starting next sampling, the top compressed data (7) is generated by use of measured data of a fraction which were collected immediately after the start. Accordingly, at the time of deleting measured data in units of files, deletion of compressed data associated with the stoppage and resuming can be easily managed. To put it in other words using the above example, when the compressed data is generated based upon 1000 pieces of measured data in combination of measured data immediately before stoppage of the sampling and measured data immediately after resuming of the sampling, it is difficult to delete compressed data in line with deletion of the measured data in units of files. Meanwhile, in the reduced display based upon the compressed data, a boundary between stoppage and resuming of the sampling cannot be displayed, and it is thus necessary to display this boundary by another means.

Naturally, it is favorable that not only compressed data, namely display data, regarding the compression ratio (Time/div.) set to 15 minutes (min.) with respect to the sampling cycle set to 100 ms, but also compressed data regarding another single or plural compression ratios be generated and stored into the compressed-data file for display.

When a plurality of compressed-data files for display with different compression ratios are prepared, as shown in FIG. 10, in a case where 1000 pieces of measured data are required with respect to one display dot for displaying a waveform by a display scaling the setting of which was changed by the user, a compressed-data file for display with a smaller compression ratio than the compression ratio requiring the 1000 pieces of data may be used to calculate display data at the compression ratio requiring the 1000 pieces of measured data.

With reference to FIG. 10 explained is an example where, in the case of displaying a waveform over the display section 2, and a compression ratio of "the number of pieces of data per display dot is 1000" is set, when a compressed-data file for display for this compression ratio is not prepared, a display is made using compressed data of a compressed-data file for display with a compression ratio of the number of pieces of data per display being smaller than 1000.

It is to be noted that, although data in the unit of 1000 pieces is compressed and displayed in the example of FIG. 10, data are present in the unit of 300 pieces of data in the example shown in the figure, where in the first 1000 pieces, four pairs of data collected in the unit of 300 pieces (1200 pieces of data) are used, and in the next 2000 pieces, three pairs of data collected in the unit of 300 pieces (900 pieces of data) are used. This is mere one example, and for example, in the first 1000 pieces, four pairs of data collected in the unit of 300 pieces of data may be used, and in the next 2000 pieces, four pairs of data from 901th data may be used. In addition, the maximum value and the minimum value of data in compression units mean the maximum value and the minimum value of data from first to 1200th data actually collected in the unit of 300 pieces.

As thus described, even when a compression ratio for which a compressed-data file for display is not prepared is set, a data file for another compression ratio can be diverted and arithmetic processing for displaying a waveform at the set compression ratio can be simplified, so as to rapidly change an image display with respect to a change in compression ratio. Display of a handwritten comment with change in compression ratio is described later.

Figure 11:
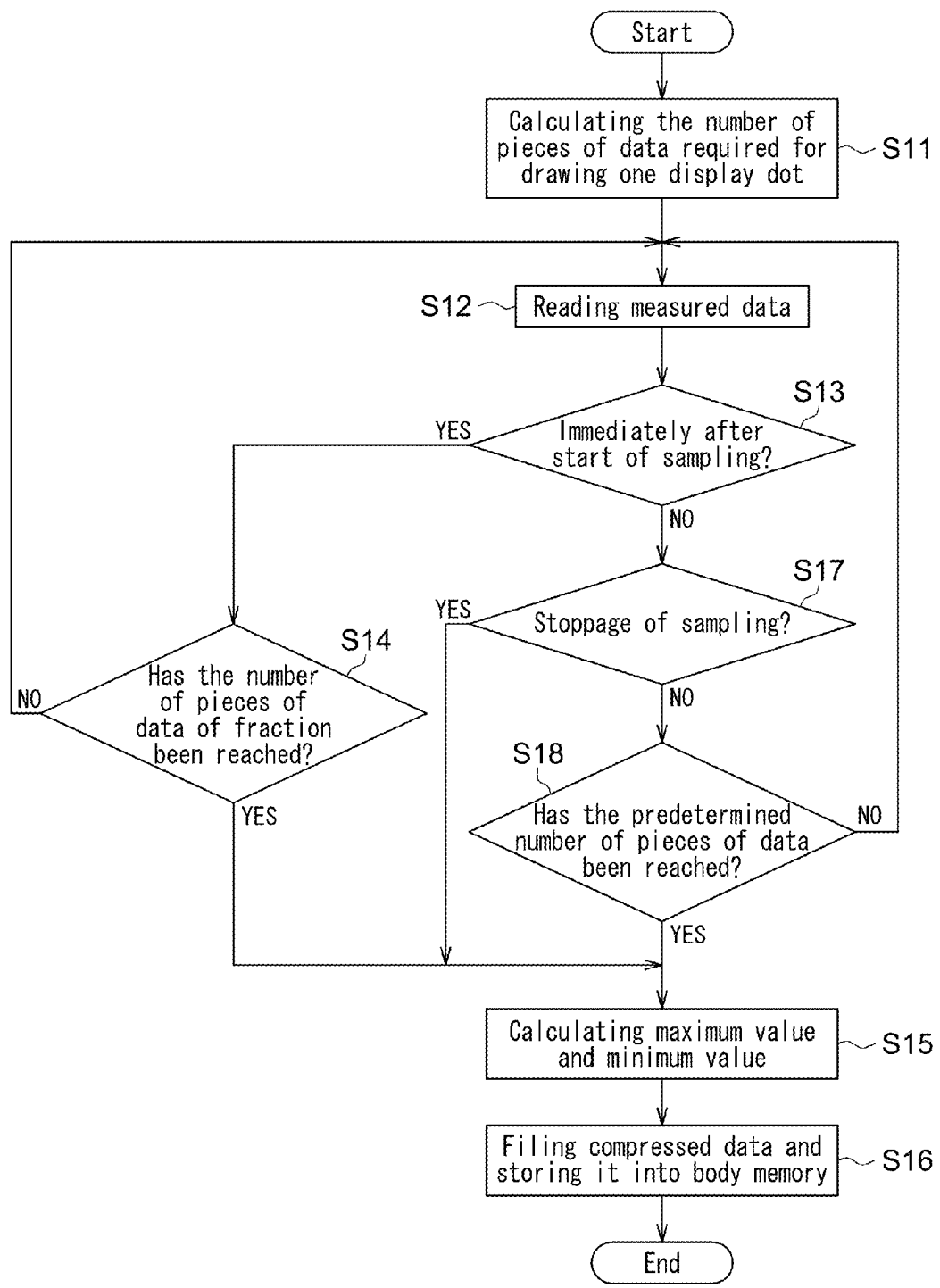
FIG. 11 is flowchart for explaining procedures for creating the compressed-data file for the reduced display.

FIG. 11 is a flowchart regarding creation of the compressed-data file for display. With reference to this FIG. 11, first, in Step S11, the number of pieces of data required for drawing one display dot at a predetermined compression ratio is calculated. Then, in next Step S12, measured data temporarily stored in the buffer memory 30 is read, and in next Step S13, it is determined whether or not to be immediately after start of sampling.

In this Step S13, when the determination is YES, namely when it is immediately after start of the sampling, the process proceeds to Step S14, and it is determined whether or not the number of pieces of data of a fraction has reached the number of pieces of data required for calculating first top compressed data immediately after start of the sampling. It should be noted that this number of pieces of data of the fraction required for calculating the top compressed data is previously calculated. When the determination is NO in above-mentioned Step S14, the process returns to Step S11, and measured data is further read. When the process again returns to Step S14 and the number of pieces of measured data not having been made into compressed data inside the buffer memory 30 reaches the number of pieces of data of the fraction, the determination is YES, and hence the process proceeds to Step S15. It is to be noted that, as for the meaning of determination of this Step S14, the above description of the top compressed data (7) immediately after stoppage and resuming of the sampling in FIG. 9 shall be referenced.

In Step S15, the maximum value and the minimum value of measured data of an object fraction are calculated to generate top compressed data, and in next Step S16, the top compressed data is stored into a corresponding compressed-data file for display. Step S16 in this series of processing constitutes a top compressed data processing device. Next, the process returns to Step S12, and measured data is read. In next Step S13, the determination is NO since the data is not one immediately after the sampling. Then, the process proceeds to Step S17, and it is determined whether or not the sampling has been stopped. When the sampling is continued, the determination is NO, and hence the process proceeds to Step S18, and it is determined whether or not the number of pieces of data has reached the predetermined number of pieces of data which was calculated in Step S11. When the number of pieces of data has not reached the predetermined number yet, the process returns to Step S12, and measured data not having been made into compressed data inside the buffer memory 30 is read. Then, when the number of pieces of measured data not having been made into compressed data reaches a predetermined number, the process proceeds to Step S15, and the maximum value and the minimum value thereof are calculated. In Step S16, the compressed data is stored into a corresponding compressed-data file for display. Step S16 in this series of processing constitutes a compressed data storing device.

In above Step S17, when the determination is YES, namely when it is determined that the sampling has been stopped, the process proceeds to Step S15, and the maximum value and the minimum value of the measured data not having been made into compressed data inside the buffer memory 30 are calculated, to create final compressed data. In next Step S16, this final compressed data is stored into a corresponding compressed-data file for display (see the above description of the final compressed data (6) in FIG. 9). Step S16 in this series of processing constitutes a final compressed data processing device.

Figure 12:
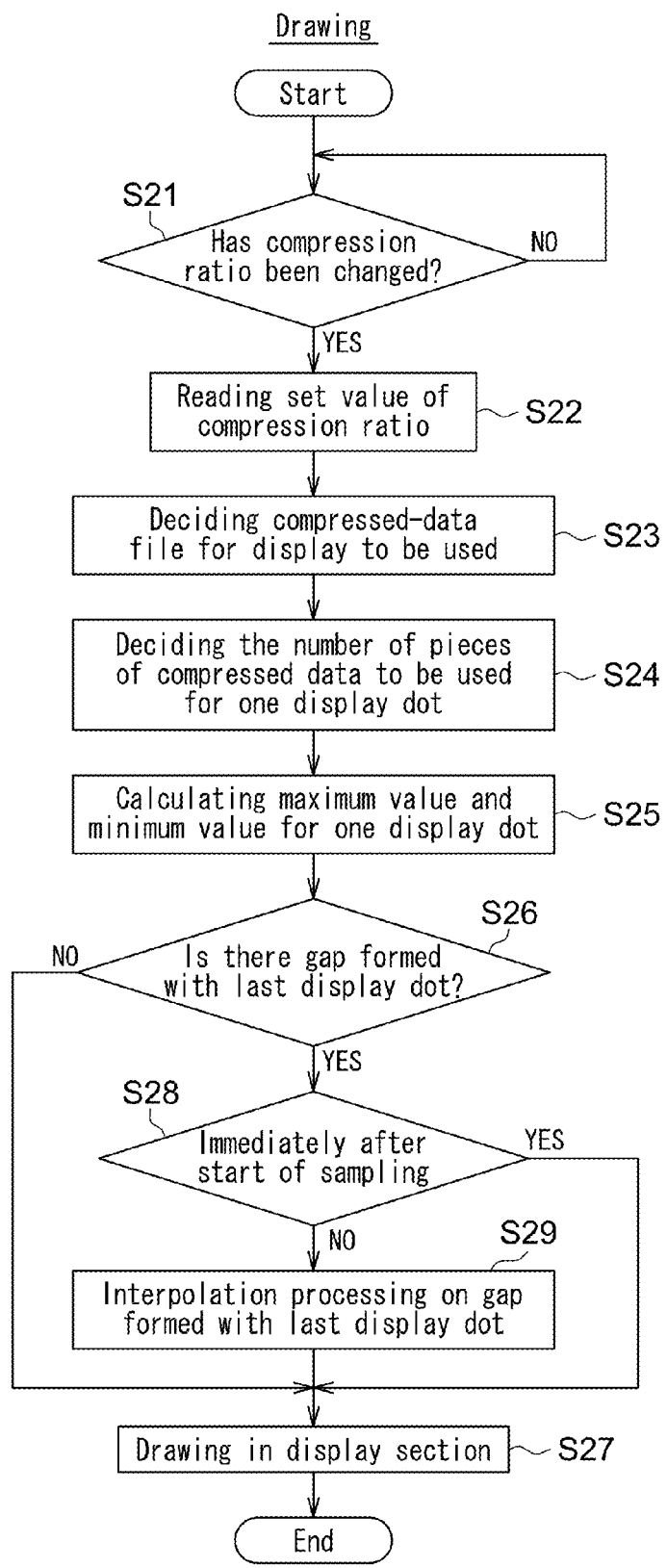
FIG. 12 is a flowchart for explaining a change in setting of the compression ratio and a series of procedures for creating compressed data in association with the change.

FIG. 12 is a flowchart for explaining an example of procedures for drawing in the display section 2 by use of the compressed-data file for display, and each step is described with reference to forgoing FIG. 10. First, it is determined in Step S21 whether or not the user has changed setting in regard to the compression ratio, and when the determination is YES (setting has been changed), the process proceeds to Step S22, and the compression ratio set by the user is read. Subsequently, in next Step S23, a compressed-data file for display to be used as display data is determined. Next, the number of pieces of compressed data to be used with respect to one display dot in the case of using the selected compressed-data file for display is decided (S24). In the case of the example of FIG. 10, this number of pieces of compressed data corresponds to four pieces of compressed data in regard to a first dot, and corresponds to three pieces of compressed data in regard to a second dot and dots subsequent thereto. Then, in next Step S25, the maximum value and the minimum value in regard to each display dot are calculated, to create recompressed data. This processing constitutes a recompressed data calculating device.

Next, in Step S26, the presence or absence of a gap formed with the last display dot is determined. When there seems to be continuity, the determination is NO. Hence the process proceeds to Step S27, and drawing is performed in the display section 2. On the other hand, when in Step S26 the determination is YES, namely when it is determined a gap formed with the last display dot is present, the process proceeds to Step S28, and it is determined whether or not the gap is one regarding a display dot immediately after stoppage and resuming of the sampling. When the determination is NO, the process proceeds to Step S29, and interpolation processing for filling the gap formed with the last display dot is performed. Thereafter, the process proceeds to Step S27, and drawing is performed in the display section 2. This series of processing constitutes an interpolation processing device. On the other hand, when the gap is one regarding a display dot immediately after stoppage and resuming of the sampling in Step S28, the determination is YES, and hence the interpolation processing (S29) is cancelled. The process proceeds to above Step S27 without performing the processing for filling the gap formed with the last display dot, and drawing is performed in the display section 2. This series of processing constitutes an interpolation processing canceling device.

Figure 13:
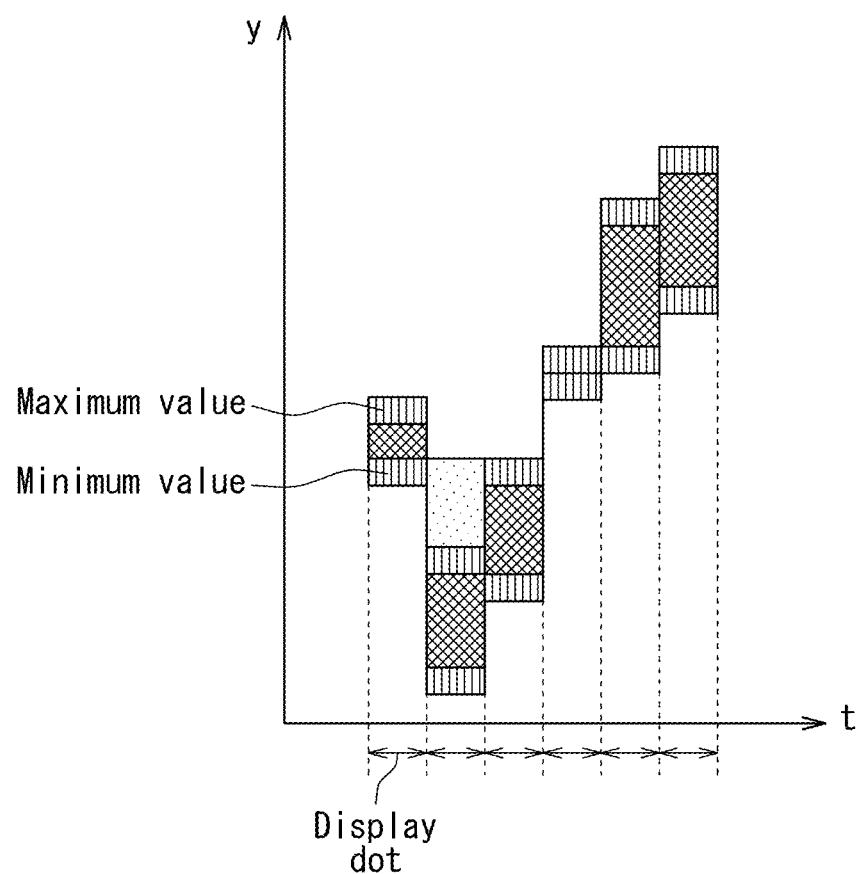
FIG. 13 is a view for explaining an example of the reduced display.

FIG. 13 shows an example of a display mode of the display section 2. A portion indicated by a plurality of dotted marks in FIG. 13 is a portion subjected to the interpolation processing of above Step S29. Further, portions indicated by a plurality of vertical lines are maximum values or minimum values. The display dots are drawn continuously due to the interpolation processing of above Step S29, but a portion where the sampling was stopped and started in the middle of the process is discontinuous due to cancellation of above Step S29, whereby the user can visually see the discontinuous portions that appear in the display section 2, to immediately know that is the portion where the sample was stopped and started. In other words, substantially the same display mode as that of the conventional chart can be provided, which is advantageous for the user familiar with the conventional chart.

Figure 14:
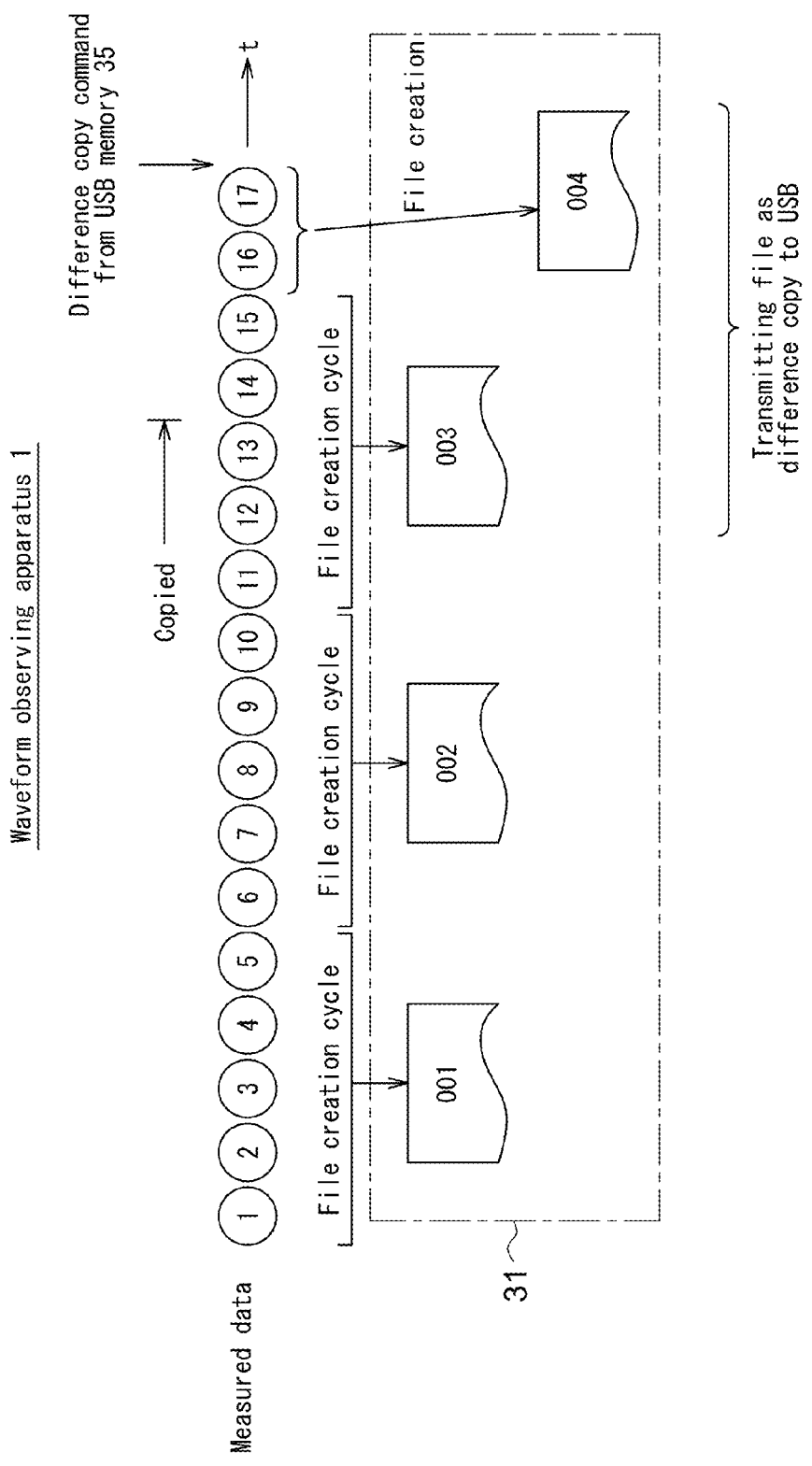
FIG. 14 is a diagram for explaining a series of processing performed by the waveform observing apparatus in regard to a difference copy.
Figure 15:
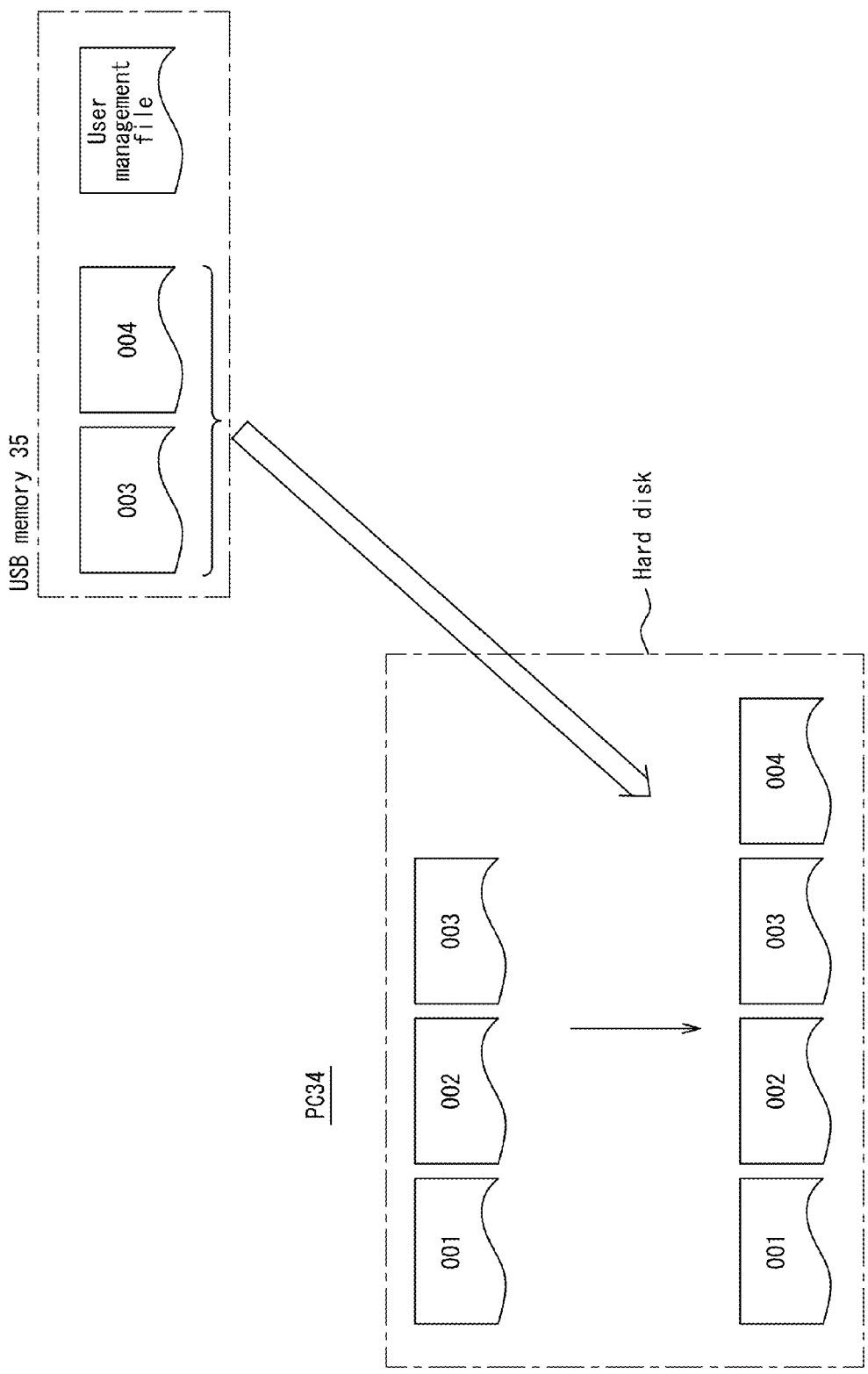
FIG. 15 is a diagram for explaining processing for supplying measured data from a USB memory to a personal computer and storing the data into the personal computer in regard to the difference copy.

FIGS. 14 and 15 are diagrams each showing a scheme of a difference copy made by use of the USB memory 35. An edit-copy program for a difference copy has been previously integrated in the waveform observing apparatus 1, and processing of FIG. 14 is executed by this edit-copy program. With reference to FIG. 14, when a command is inputted from the USB memory 35 into the waveform observing apparatus 1 at the time of sampling measured data, sixteenth and seventeenth measured data which are not yet filed and a new measured data file for housing handwritten comment information associated with the sixteenth and seventeenth measured data are generated in the body memory 31. A file name including the serial number 004 is given to the measured data file, and also the sixteenth and seventeenth measured data and handwritten comment information associated therewith which are temporarily stored in the buffer memory 30 are housed into this new fourth measured data file 004.

Assuming that data up to thirteenth measured data have been previously copied, currently, a third measured data file 003 housing the thirteenth measured data houses eleventh to fifteenth measured data. In the USB memory 35, written as objects of the difference copy are copies of the third measured data file 003 and the eleventh to fifteenth measured data housed therein, and the fourth measured data file 004 that was exceptionally created before the normal file creation cycle and given the file name including the serial number and the sixteenth and seventeenth measured data housed therein.

FIG. 15 shows measured data files stored in an internal memory of the personal computer 34. Before capturing of the third measured data file 003 and the fourth measured data file 004 from the USB memory 35, first to third measured data files 001 to 003 are stored in the personal computer 34, but the contents of the third measured data file 003 are the eleventh to thirteenth measured data. When the third measured data file 003 and the fourth measured data file 004 are transmitted from the USB memory 35 to the personal computer 34, the third measured data file 003 is overwritten. Therefore, after reception of the data from the USB memory 35, the personal computer 34 is in the state of housing the first measured data file 001 to the fourth measured data file 004 and handwritten comment information associated therewith. The third measured data file 003 includes the eleventh to fifteenth measured data and handwritten comment information associated therewith. Meanwhile, the contents of the fourth measured data file 004 are the sixteenth and seventeenth measured data and handwritten comment information associated therewith. Those contents are the same as the contents of the body memory 31 of the waveform observing apparatus 1 at the time of receiving the difference copy command from the USB memory 35.

As thus described, managing measured data in units of files can not only ensure convenience in use of measured data, but also prevent leakage of data in seeking a cause of inconvenience in use of the personal computer 34 since a difference copy including measured data temporarily stored in the buffer memory 30 at the time of executing the difference copy of measured data by use of the USB memory 35 is supplied to the personal computer 34. It goes without saying that, with the use of the difference copy, writing of data from the waveform observing apparatus 1 into the USB memory 35 and writing of the USB memory 35 into the personal computer 34 can be made efficient.

Figure 16:
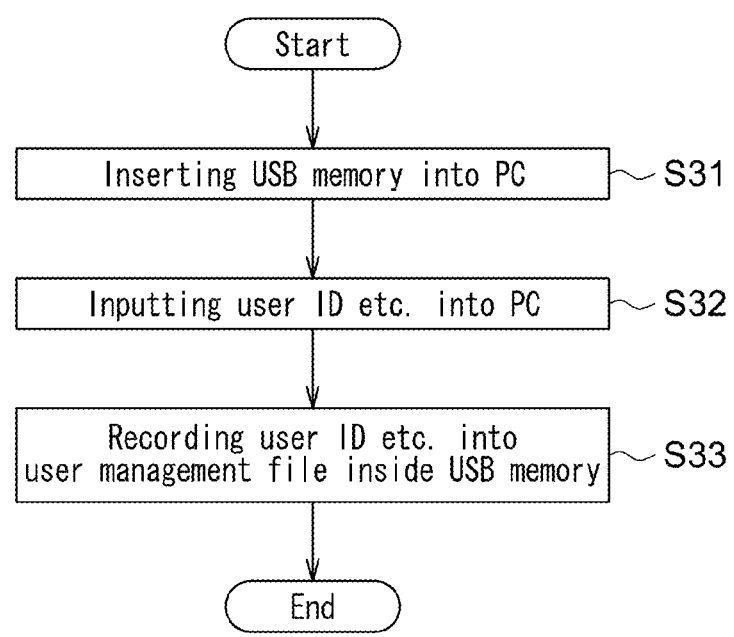
FIG. 16 is a flowchart for explaining a series of processing for initializing the USB memory to create a user management file.

A specific one example regarding the difference copy is described with reference to flowcharts of FIGS. 16 to 18. FIG. 16 shows procedures regarding initial setting of the USB memory 35. The personal computer 34 has been previously integrated with a program regarding a copy of measured data, and using this personal computer 34, initial setting of the USB memory 35 can be performed. In Step S31, the USB memory 35 is inserted into the personal computer 34, and after the data copy program of the personal computer 34 has been activated, necessary items such as a user ID and a password are inputted on an initial setting screen displayed on a monitor of the personal computer 34 (S32) so that a user management file housing the necessary items is stored into the USB memory 35 (S33).

Figure 17:
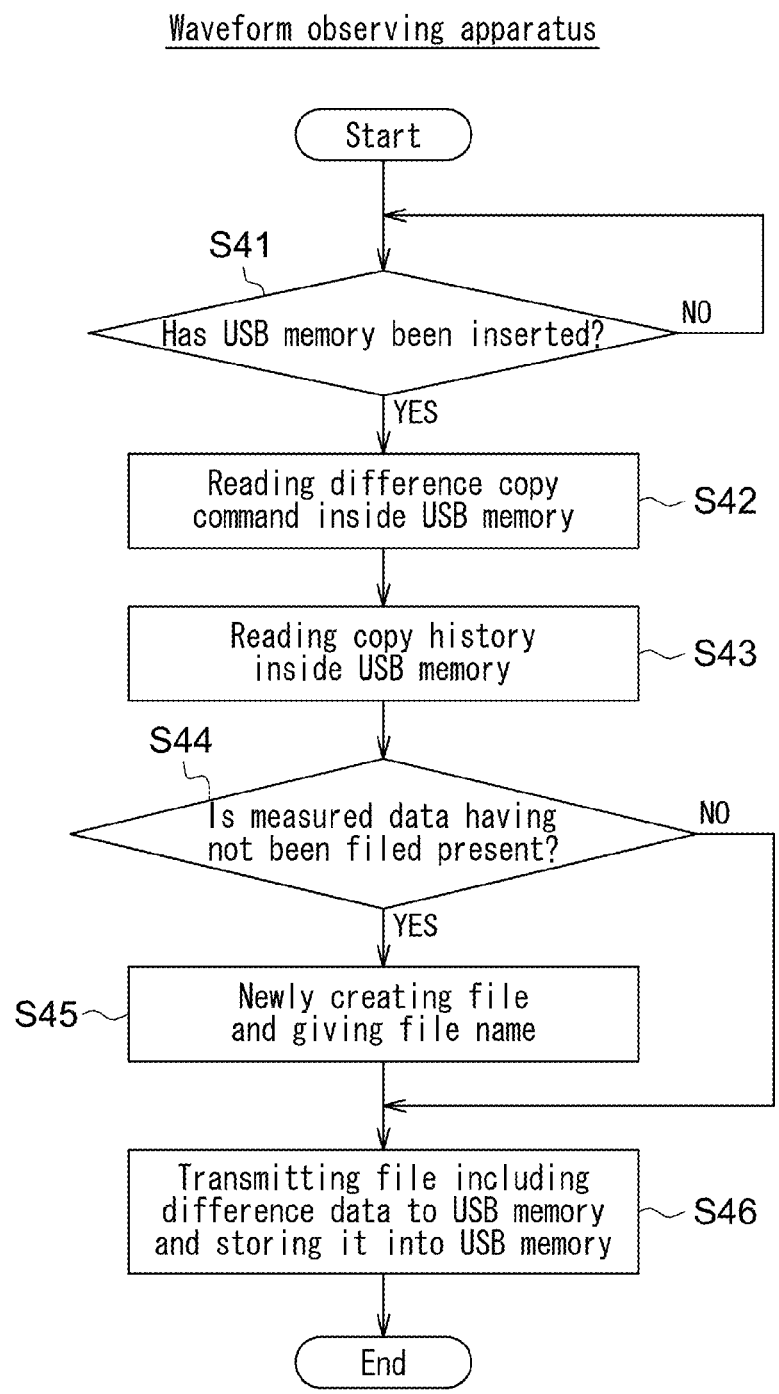
FIG. 17 is a flowchart for explaining a series of processing from insertion of the USB memory into the waveform observing apparatus to writing of the difference data into the USB memory.

FIG. 17 shows procedures for acquiring the difference copy from the waveform observing apparatus 1 by use of the USB memory 35. When the USB memory 35 is inserted into the waveform observing apparatus 1 and the user ID and the password are inputted for log-in (S41), an edit-copy program activating command and a difference copy command are transmitted from the USB memory 35 to the waveform observing apparatus 1 (S42), and thereby, the waveform observing apparatus 1 executes reading of a copy history stored in the USB memory 35 (S43). Naturally, the waveform observing apparatus 1 may store the copy history of the user.

With reference to the copy history, in the case of the example of FIG. 14, when the measured data up to the thirteenth measured data have been copied, the presence or absence of measured data having not been filed is determined, other than the existing third measured data file 003 storing measured data after the thirteenth measured data up to the fifteenth measured data (S44). When the determination is YES, namely in the case of the example of FIG. 14, when the temporarily stored sixteenth measured data, the latest seventeenth measured data, and handwritten comment information associated therewith are present in the buffer memory 30 at the time of receiving the copy command from the USB memory 35, in next Step S45, a new measured data file is created in the body memory 31 of the waveform observing apparatus 1, and also the file name including the serial number (004) is given to the new measured data file, and the sixteenth and seventeenth measured data are housed into this fourth measured data. Subsequently, in next Step S26, copies of the third measured data file 003, the fourth measured data file 004, and handwritten comment information associated therewith are supplied to the USB memory 35, and written into the USB memory 35.

When in above Step S44, the determination is NO, namely when temporarily stored measured data having not been filed is not present in the buffer memory 30, the process shifts to Step S46, and out of the measured data files stored in the body memory 31 of the waveform observing apparatus 1, a measured data file including measured data of the difference is supplied to the USB memory 35, and written into the USB memory 35.

Figure 19:
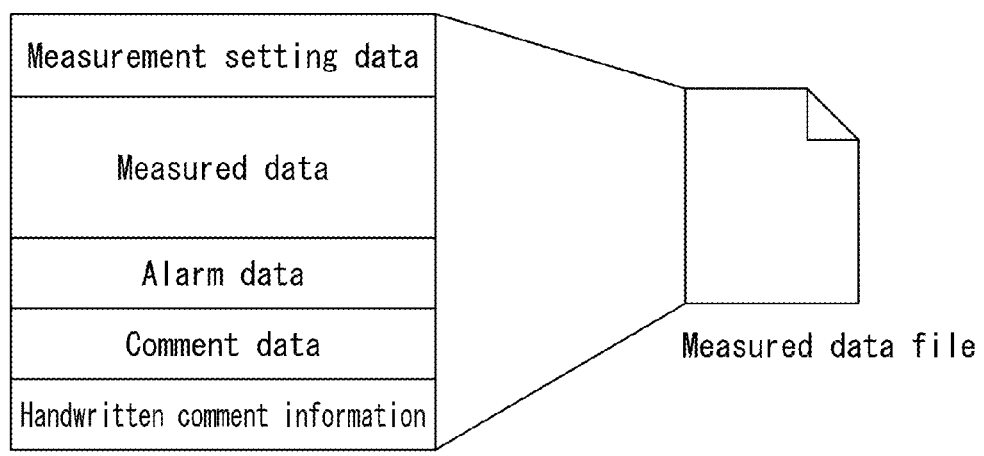
FIG. 19 is a diagram for explaining a summary of contents of a measured data file stored in a body memory of the waveform observing apparatus.

FIG. 19 is a diagram for explaining the contents of the measured data file. The measured data file houses: measurement setting data that was set at the time of collecting data in the waveform observing apparatus 1; an alarm that was generated during a period of collecting measured data housed in the measured data file; and handwritten comment information that was inputted by the user, and it should be understood that the difference of the above measured data includes these alarm and handwritten comment.

Figure 18:
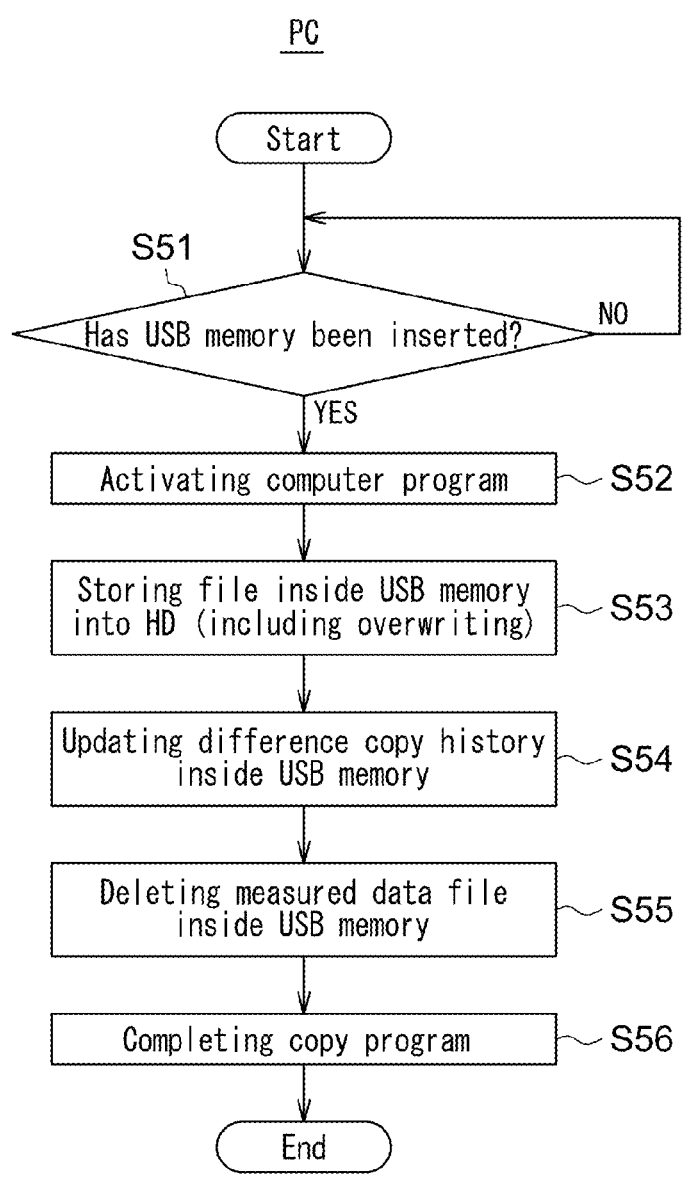
FIG. 18 is a flowchart for explaining a series of processing from insertion of the USB memory having received the difference data into the personal computer to writing of the difference data into the personal computer.

With reference to FIG. 18, procedures for transmitting data from the USB memory 35 to the personal computer 34 are described. When the USB memory 35 is inserted into the personal computer 34, the process proceeds from Step S51 to next Step S52, and a measured data copying program of the personal computer 34 is activated. By this measured data copying program, a measured data file stored in the USB memory 35 is captured, and the captured measured data file is stored into a hard disk as an internal memory of the personal computer 34 (S53).

Step S54 is described in the case of the forgoing example of FIG. 15. Before reception of the difference data from the USB memory 35, the hard disk of the personal computer 34 stores the first measured data file 001 to the third measured data file 003 and handwritten comment information associated therewith, and the contents of the third measured data file 003 are the eleventh to thirteenth measured data and handwritten comment information associated therewith. Upon receipt of copies of the third measured data file 003, the fourth measured data file 004 and handwritten comment information associated therewith as the difference data from the USB memory 35, the third measured data file 003 is overwritten. Therefore, while the hard disk of the personal computer 34 after reception of the difference data from the USB memory 35 comes into the state of storing the first measured data file 001 to the fourth measured data file 004, the third measured data file 003 includes the eleventh to fifteenth measured data and handwritten comment information associated therewith.

Upon completion of transmission of the copy of the measured data file from the personal computer 34 in Step S53, the process proceeds to Step S54, and the copy history file of the USB memory 35 is updated, to write into the USB memory 35 that the measured data up to the seventeenth measured data have been copied. Further, in Step S55, the third measured data file 003 and the fourth measured data file 004 inside the USB memory 35 are deleted. Upon completion of a series of these steps, the measured data copying program of the personal computer 34 is completed (S56).

Figure 20:
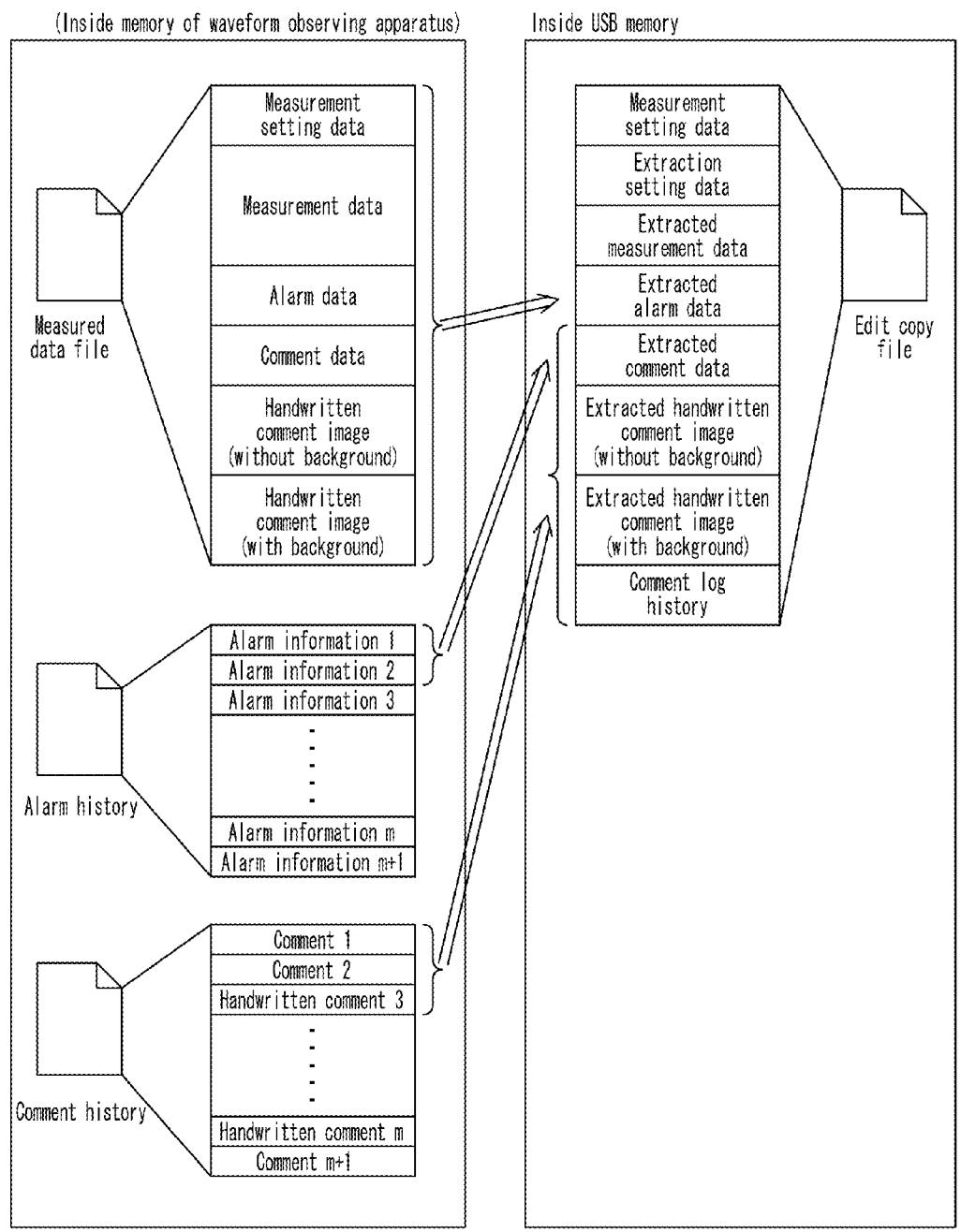
FIG. 20 is a diagram for explaining information for writing the difference copy from the body memory of the waveform observing apparatus into the USB memory.

FIG. 20 schematically shows a variety of files stored in the body memory 31 of the waveform observing apparatus 1, and the contents of the difference copy written into the USB memory 35. Handwritten comments included in the measured data file includes first image information without a background and second image information with a background, which are detailed later. An edit-copy file for the difference copy to be written into the USB memory 29 includes a comment log history in addition to measured data, the first image information without a background and the second image information with a background.

Figure 21:
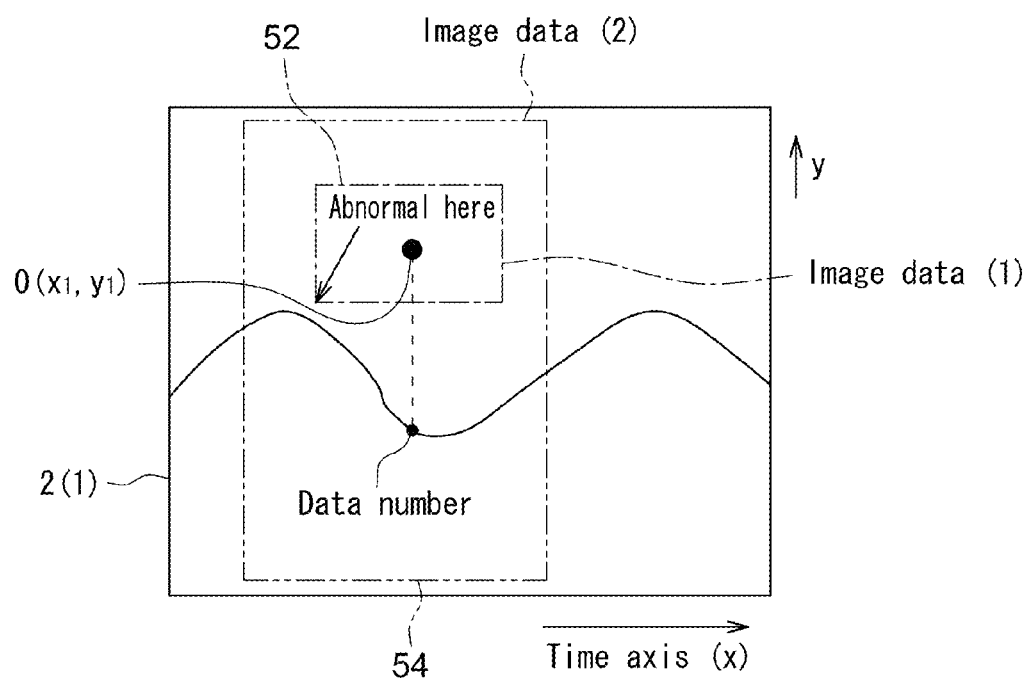
FIG. 21 is a view for explaining first image information obtained by imaging the handwritten comment, and second image information obtained by imaging a partial waveform in the vicinity of the handwritten comment along with the handwritten comment, in association with image information of the handwritten comment.

FIG. 21 is a diagram for explaining the first image information without a background and the second image information with a background. While the display section 2 of the waveform observing apparatus 1 is provided with the touch panel 222 as has been described above, FIG. 21 shows an example of hand-writing an "arrow" and a comment "abnormal here" by use of the touch panel 222.

Figure 22:
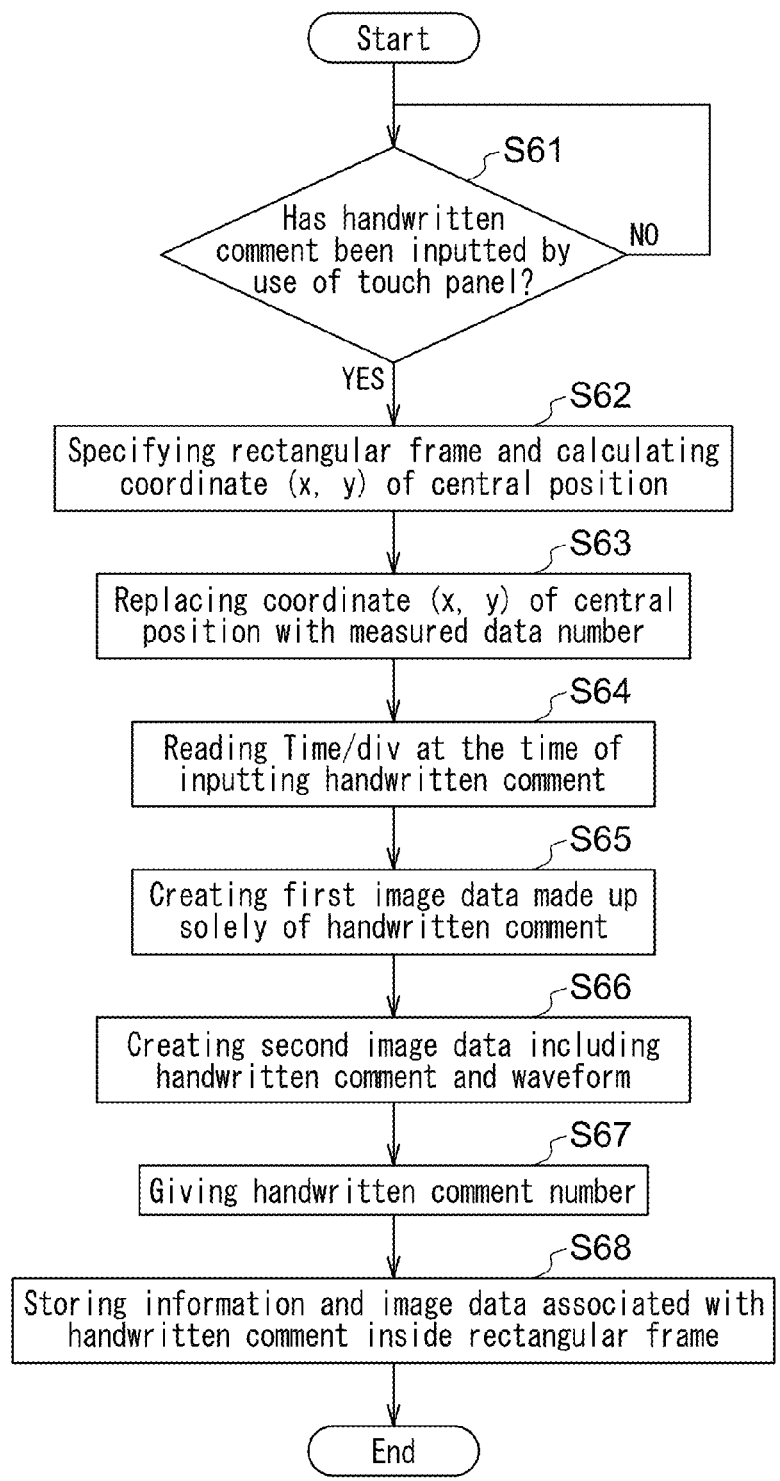
FIG. 22 is a flowchart for explaining a series of procedures for generating the first and second image information from the handwritten comment written by use of a touch panel of the waveform observing apparatus.

FIG. 22 shows procedures regarding creation of image information of a handwritten comment. With reference to FIG. 22, when a handwritten comment is written into the touch panel 222, the process proceeds from Step S61 to Step S62. In Step S62, a rectangular frame 52 circumscribing a portion where the comment was hand-written is created, and a coordinate (x1, y1) of a central position O of the frame 52 is calculated. Subsequently, in Step S63, the coordinate (x1, y1) of the touch panel 222 is replaced by a measured data number N that specifies the time-axial direction (x1) of the central coordinate. This replacement is meant by that in the present embodiment, at the time of specifying a time-axial input position for a handwritten comment with reference to the waveform, the specification is performed based upon the number of pieces of waveform data (measured data number N) counted from the first waveform data. Further, needless to say, as data of a comment redisplayed position in the case of redisplaying the handwritten comment in a variety of forms with respect to the waveform, this number of pieces of waveform data (measured data number N) is stored into the body memory 31 in association with a variety of commend data. Further, as a method for specifying the time-axial input position of this handwritten comment with respect to the waveform, a technique may be employed, the technique directly specifying a time-axis where the comment was inputted and storing the input time so as to store the input position in association with a variety of comment data. Moreover, as for the handwritten comment, by a coordinate (y1) in the Y-direction of the touch panel 222, information in the height direction of the coordinate (x1) in the X-direction of the comment is also stored into the body memory 31 as the data of a comment redisplay position in association with a variety of comment data.

In next Step S64, a compression ratio (Time/div) of the waveform in the display section 2 at the time of writing the handwritten comment is read, and first handwritten comment image information without a background is created. Next, in Step S66, the portion where the comment was handwritten is created as second handwritten comment image information with a background. While the size of a frame 54 of this second image information is arbitrarily settable by the user, the second image information includes a waveform in the vicinity of the written handwritten comment as an image, along with the handwritten comment. Then, in Step S67, the first image information is given a comment number, a compression ratio (Time/div.) of the waveform display at the time of creating the comment, positional information of the center O of the rectangular frame 52, and a time T specifying the time-axial length of the rectangular frame 52. A series of steps except for Step S66 constitutes a first image information generating device. The second image information is associated with the first image information by means of the measured data number N included in the first image information, and the like.

Apart from the first and second image information associated with the handwritten comments, letter strings for simple indications are registered. Specifically, a method of automatically registering letters for register as text or image information may be adopted, or a method of setting and registering desired letters as text or image information by the user may be adopted. Further, a method of performing letter recognizing processing on a comment inputted as a handwritten comment to automatically recognize the letters and set the recognized letters as text or image information may be adopted. As the method for automatically registering letters for register as text or image information, a method of registering a date and time when the handwritten comment is inputted and a comment number given to the comment is considered. It is therefore preferable to allow the user to select the foregoing variety of simple indication forms for displaying a simple indication according to the need. It is to be noted that this simple-indication registering is performed by use of the PC 34. Further, it goes without saying that a simple indication corresponding to each registered handwritten comment is stored into the body memory 31 along with comment redisplayed position data for the case of redisplay with respect to a waveform.

Figure 23:
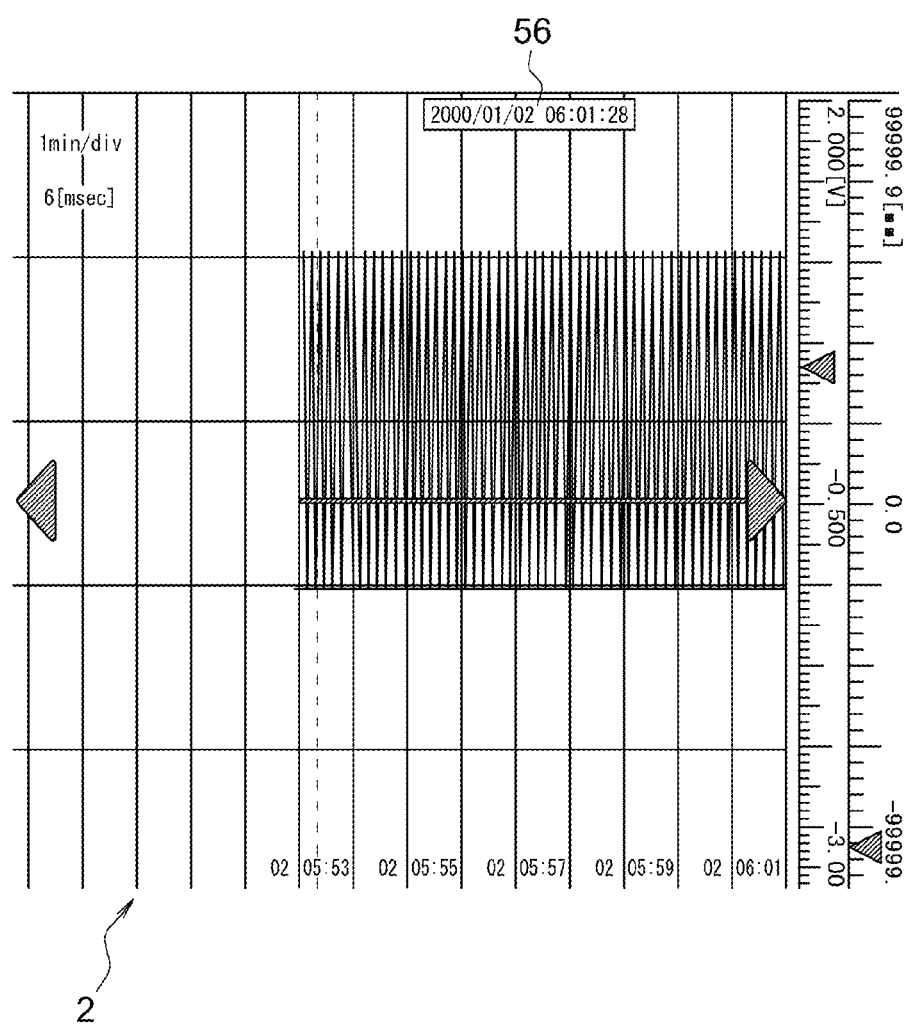
FIG. 23 is a view for explaining an example of drawing a simple indication indicating the presence of a handwritten comment when a waveform is formed at a different compression ratio from a compression ratio at the time of writing the handwritten comment.

With reference to FIG. 23, in the waveform observing apparatus 1, when setting of the compression ratio (Time/ div.) is changed to a different compression ratio from the compression ratio at the time of writing the handwritten comment, a simple indication 56 indicating the presence of the handwritten comment is displayed, instead of handwritten comment, in a position corresponding to a portion where the handwritten comment was written.

Figure 24:
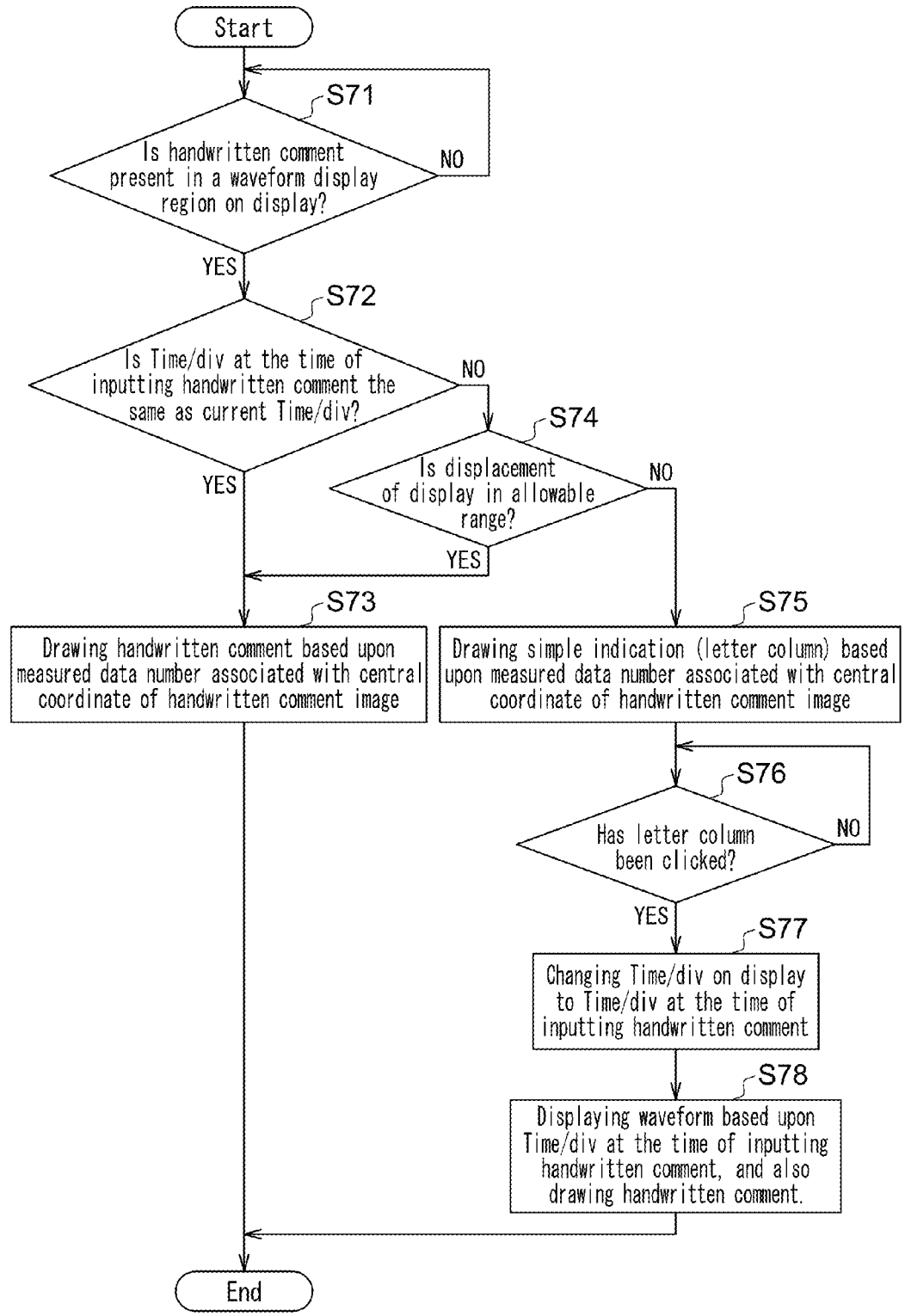
FIG. 24 is a flowchart for explaining procedures in the case of drawing the handwritten comment and in the case of drawing the simple indication based upon the compression ratio at the time of writing the handwritten comment relative to a currently set compression ratio, in association with the waveform display and the display of the handwritten comment in the waveform observing apparatus.

This respect is detailed based upon a flowchart of FIG. 24. In Step S71, when a handwritten comment is present in association with a waveform on display in the waveform observing apparatus 1, the process proceeds to Step S72, and it is determined whether or not the current compression ratio (Time/div.) is the same as the compression ratio at the time of writing the handwritten comment. When the determination is YES (the same), the process proceeds to Step S73, the first image information is read, and the handwritten comment is displayed as superimposed on a waveform displayed in the display section 2 of the waveform observing apparatus 1. More specifically, when the CPU (control device) 29 makes the display section 2 display part of the entire waveform and the operator scrolls the displayed waveform, waveform positional information displayed in the display section 2 (e.g. the number of pieces of waveform data given sequentially from a first waveform data with respect to the entire waveform stored, namely the measured data number N) is recognized, and when first image information having positional information in line with the displayed waveform positional information is present, at that point, the first image information is called up from the body memory 31, and displayed in the display section 2.

In above Step S72, when the current compression ratio (Time/div.) differs from the compression ratio at the time of writing the handwritten comment, the determination is NO, and hence the process proceeds to Step S74. When the handwritten comment 50 is displayed at the current compression ratio, it is determined whether or not displacement of the handwritten comment 50 is in an allowable range. When the determination is YES, namely when the displacement is in the allowable range, the process proceeds to Step S73, and the first image information is read, to display an image of the handwritten comment 50 in the display section 2.

In above Step S74, when the determination is NO, namely when the current compression ratio differs from the compression ratio at the time of writing the handwritten comment in displaying the handwritten comment 50 to such a degree as to cause occurrence of non-allowable displacement, the process proceeds to Step S75, and a simple indication 56 (FIG. 23) indicating the presence of the handwritten comment is made in a position associated with a portion of the waveform corresponding to the measured data number. Namely, using any of the foregoing techniques, the simple indication with respect to the handwritten comment, which is stored inside the body memory 31, is called up from the body memory 31 at the time of becoming consistent with the time-axial direction of the waveform that is displayed while scrolled in the display section 2, and the simple indication is displayed in the display section 2 along with the waveform.

By looking at the simple indication 56 displayed by this simple indication drawing device, the user can be aware of the presence of the handwritten comment in the relevant portion. When this simple indication 56 is clicked by the user, the process proceeds from Step S76 to Step S77, and the current compression ratio (Time/div.) in the display section 2 is forcefully changed, to switch the display to a display at the compression ratio at the time of writing the handwritten comment, and also in Step S78, the image of the handwritten comment 50 is displayed in the relevant portion.

As a modified example of the forced change in compression ratio, when the user clicks the simple indication 56, the second image information may be read, and an image of a handwritten comment with a background, namely a handwritten comment and a partial waveform image, may be displayed for example in one corner of the display section 2.

Therefore, when the simple indication 56 is displayed, it is possible for the user to know the presence of the handwritten comment in the relevant portion without the need for paying attention to the height of the currently set compression ratio and the compression ratio at the time of writing the handwritten comment, and when wishing to know the contents of the handwritten comment, it is possible to click the simple indication 56, so as to make the handwritten comment displayed, along with a waveform display based upon the compression ratio at the time of writing the handwritten comment 50. Naturally, since the waveform is displayed at the compression ratio at the time of writing the handwritten comment, it is possible to make the handwritten comment 50 displayed in the same state as the user wrote it without occurrence of any displacement.

Figure 25:
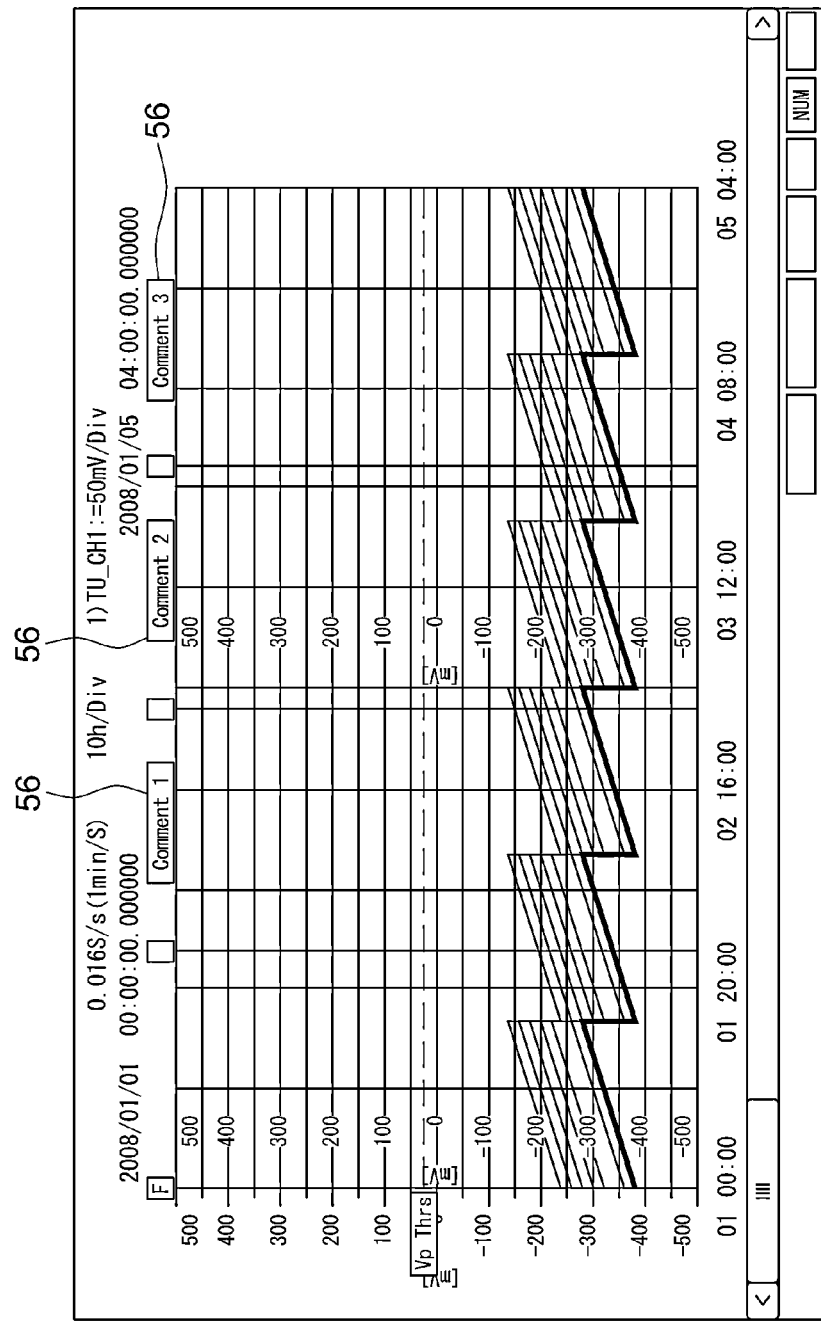
FIG. 25 is a view for explaining an example of drawing a simple indication indicating the presence of a handwritten comment in a waveform display in an external PC.
Figure 26:
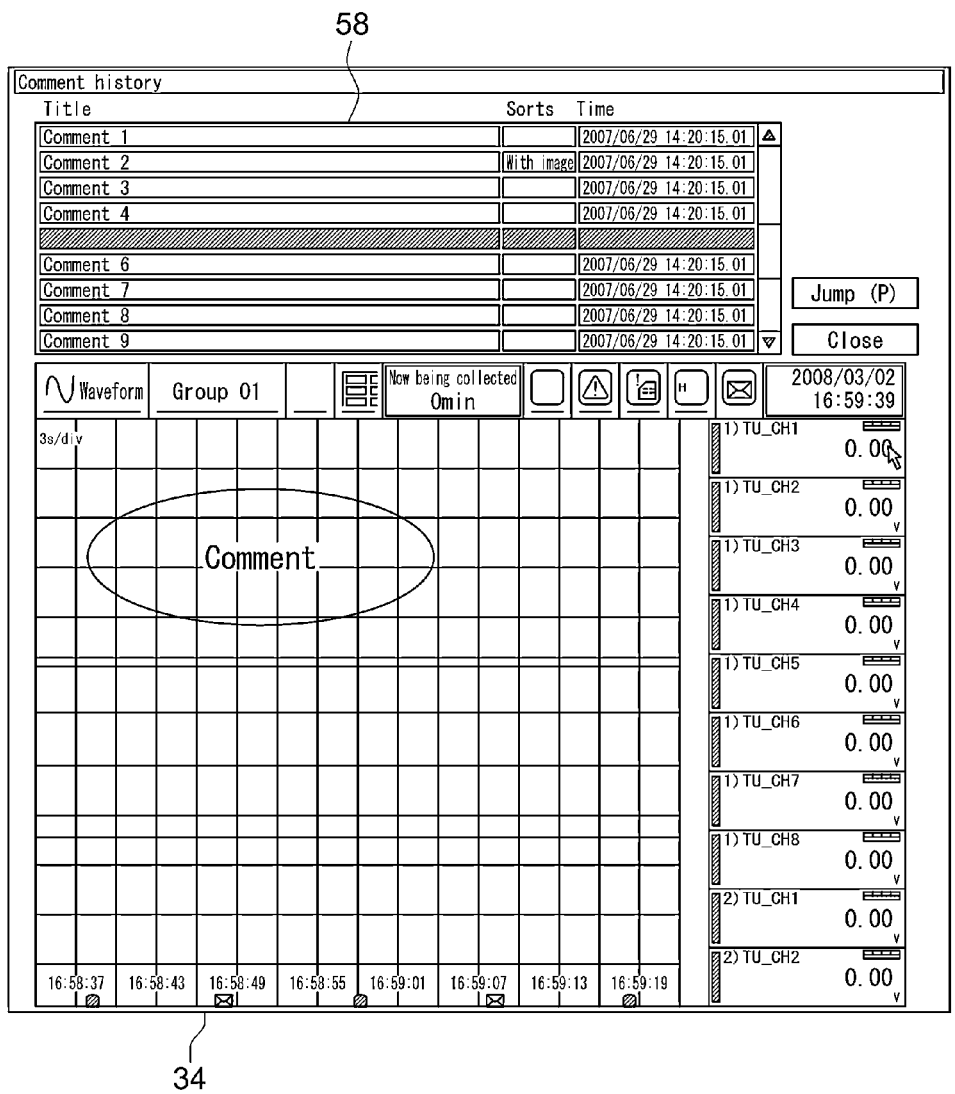
FIG. 26 is a view for explaining an example of displaying a comment historical log list by clicking the simple indication in the external PC.
Figure 27:
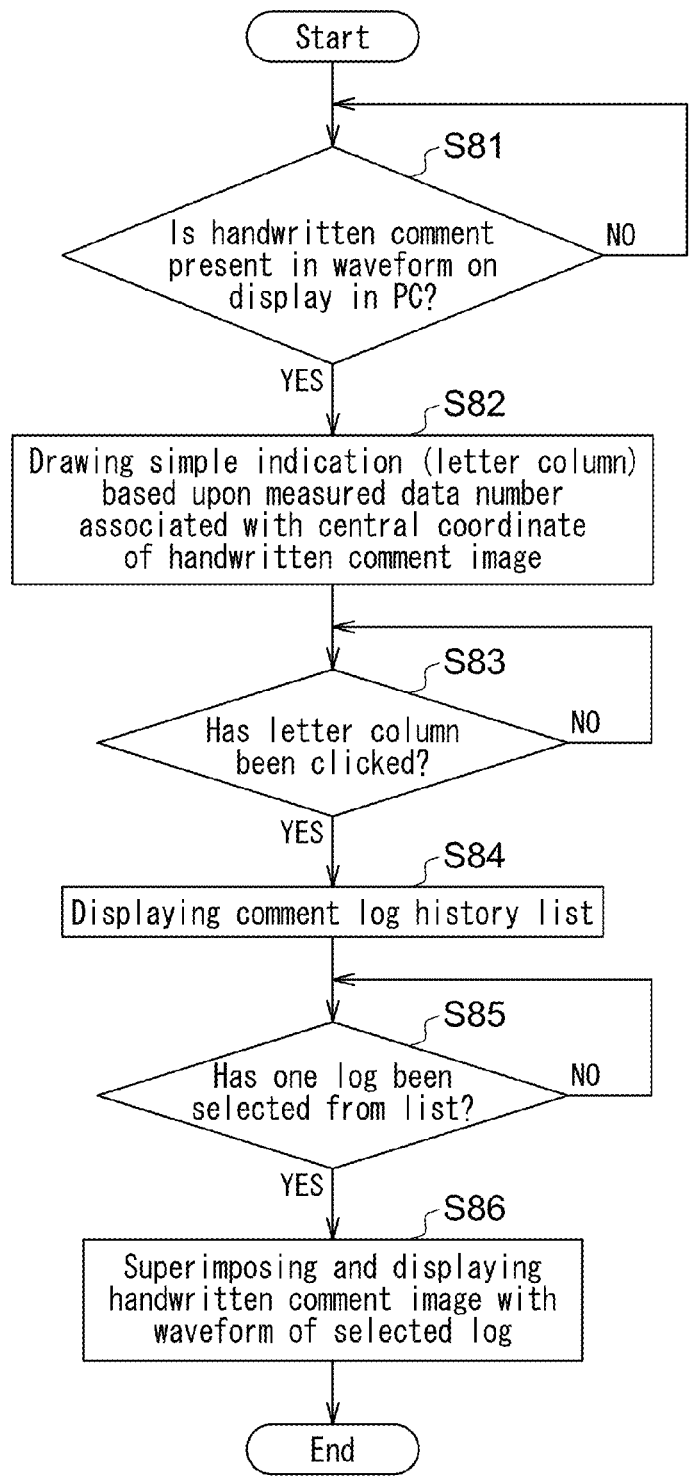
FIG. 27 is a flowchart for explaining a series of procedures for drawing associated with the handwritten comment in the external PC.

FIGS. 25 to 27 are views each regarding a display of a handwritten comment in association with a waveform display by use of the PC 34 (FIG. 4). The number of dots on the monitor screen of the PC 34 typically differs from that in the display section 2. In the waveform display by use of the PC 34, as shown in FIG. 25, the presence of the handwritten comment is displayed by the simple indication 56. When this simple indication 56 is clicked, a comment log history list is displayed (FIG. 26), and when a desired comment (comment 5 in the case of the example of the figure) is selected, second image information of the comment 5 is read into the PC 34, and a handwritten comment with a background, namely a handwritten comment and an image of a partial waveform, is displayed in the PC 34.

The handwritten-comment display in the PC 34 is described based upon a flowchart of FIG. 27. First, when a handwritten comment is present in a waveform on display in the PC 34 in Step S81, the determination is YES, and hence the process proceeds to Step S82, and the simple indication 56 is displayed in a position corresponding to a measured data number in the displayed waveform. Then, when a desired simple indication 56 is clicked from the simple indications 56 on display in the PC 34, a comment historical log list 58 (FIG. 26) is displayed (S84). Then, by selecting one log (comment) from this list 58, second image information associated with the selected comment is read into the PC 34, and an image of a handwritten comment including a partial waveform is displayed in the PC 34 (S86).

As a modified example, in place of the above comment historical log list 58, second image information associated with the simple indication 56 may be read by clicking the simple indication 56 on display in the PC 34, to display an image of a handwritten comment including a partial waveform in the personal computer 34.

It goes without saying that, when displacement of the handwritten comment does not occur in the waveform display in the PC 34 even with the handwritten comment displayed in a predetermined position based upon the first image information, the handwritten comment image 50 (FIG. 1) can be displayed in a predetermined position of the waveform on display in the PC 34, as in the waveform observing apparatus 1.

Although the displayed waveform and handwritten comment in association with the waveform observing apparatus 1 are described above, it is natural that the present invention is equally applicable to a waveform observing apparatus having functions of enlarged/reduced displays in two directions, a time-axial direction (x) and a measured value direction (y), such as an oscilloscope.

Figure 28:
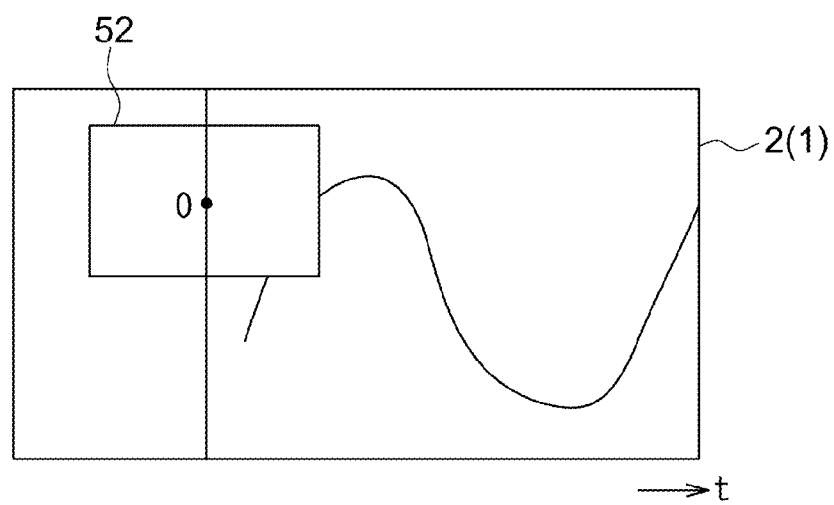
FIG. 28 is a view for explaining a case where an input of a handwritten comment is canceled in the waveform observing apparatus.
Figure 29:
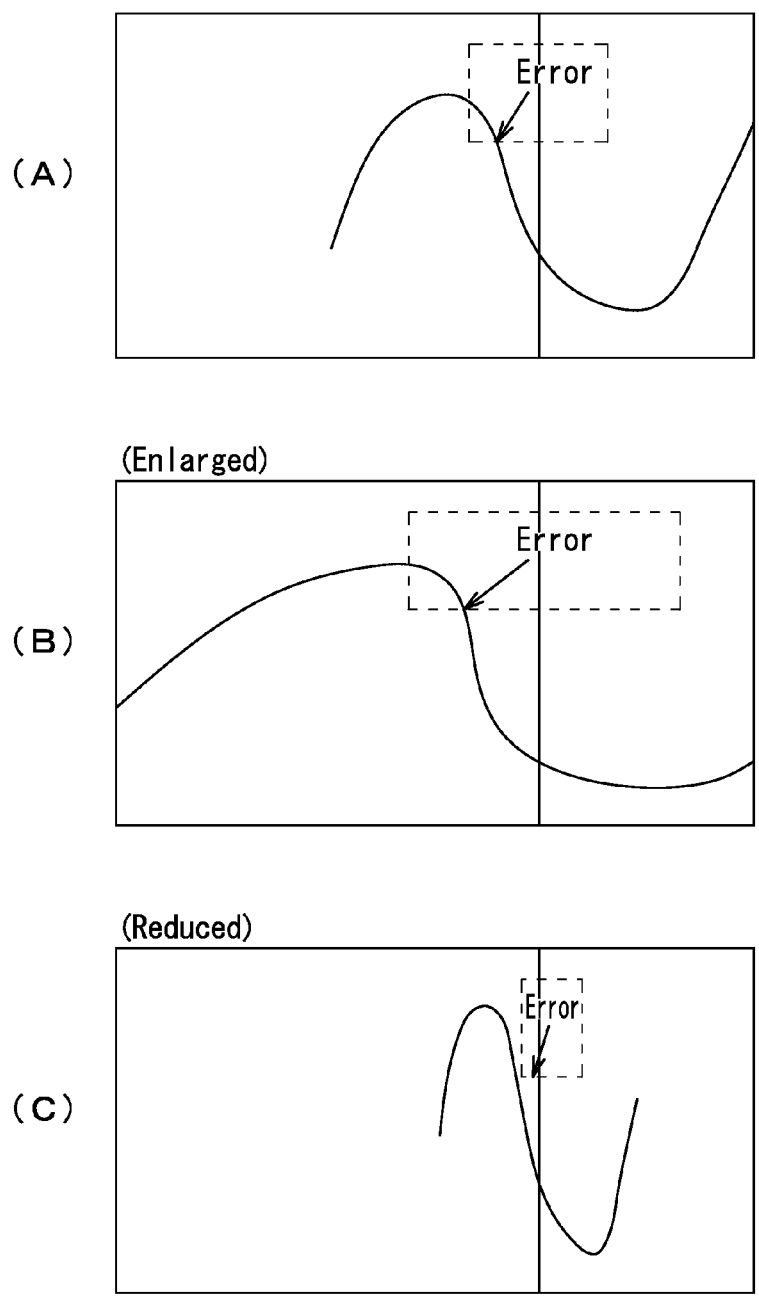
FIGS. 29A to 29C are a view for explaining a problem of occurrence of displacement between a handwritten comment and a waveform with change in display compression ratio, where

Further, as shown in FIG. 28, in the waveform observing apparatus 1, when a handwritten comment is written in a portion time-axially deviating from the waveform on display in the display section 2, it is favorable to cancel this writing and also display an error message.

What is claimed is:

1. A waveform observing apparatus, comprising a touch panel in a display section and allowing a handwritten comment to be written in a desired place of a displayed waveform by use of the touch panel, the apparatus including:
   a first image information generating device for generating first handwritten comment image information which includes a compression ratio of a waveform display at the time of writing a first handwritten comment by use of the touch panel, along with first image information of the first handwritten comment;
   a simple indication registering device for registering a simple indication for displaying the simple indication corresponding to the first handwritten comment;
   a memory device for storing the first handwritten comment image information and the registered simple indication;
   a compression ratio setting device for setting a compression ratio of the waveform display of the waveform observing apparatus; and
   a control device, which
   calls up the first handwritten comment image information of the first handwritten comment from the memory device and displays as superimposing the first image information on the displayed waveform having a time-axial position where the first handwritten comment should be displayed in the display section of the waveform observing apparatus on the occasion when the waveform is displayed in determination of the compression ratio set by the compression ratio setting device to be the same as the compression ratio at the time of writing the handwritten comment from the waveform on display in the waveform observing apparatus at the time of displaying the image, and
   calls up the simple indication corresponding to the first handwritten comment from the memory device and displays as superimposing the first image information on the waveform having a time-axial position where the first handwritten comment should be displayed in the display section of the waveform observing apparatus on the occasion when the waveform is displayed in determination of the compression ratio set by the compression ratio setting device to be different from the compression ratio at the time of writing the first handwritten comment and not within the allowable range for displacement of the image of the first handwritten comment from the waveform on display in the waveform observing apparatus at the time of displaying the image, or
   calls up the first handwritten comment image information of the first handwritten comment from the memory device and displays as superimposing the first image information on the displayed waveform having a time-axial position where the first handwritten comment should be displayed in the display section of the waveform observing apparatus on the occasion when the waveform is displayed in determination of the compression ratio set by the compression ratio setting device to be different from the compression ratio at the time of writing the first handwritten comment but within the allowable range for displacement of the image of the first handwritten comment from the waveform on display in the waveform observing apparatus at the time of displaying the image.

2. The waveform observing apparatus according to claim 1, further including:
   a simple indication selecting device, with which a user selects the simple indication; and
   a compression ratio forcefully changing device which, when the user selects the simple indication, changes setting of the currently set compression ratio to the compression ratio at the time of writing the first handwritten comment to redraw the waveform on display in the waveform observing apparatus at the compression ratio at the time of writing the first handwritten comment, and also displays the first handwritten comment in a predetermined position of the displayed waveform.

3. The waveform observing apparatus according to claim 1, further having
   a second image information generating device for generating second image information with a background which includes a second handwritten comment written by use of the touch panel and a partial waveform in the vicinity of the second handwritten comment, wherein
   the second image information is stored into the memory device in association with the first handwritten comment image information, and
   when the simple indication is called up from the memory device, the second image information is read, and an image of the second handwritten comment including the partial waveform is displayed in the display section of the waveform observing apparatus, along with the waveform on display in the waveform observing apparatus.

4. A waveform observing system, comprising the waveform observing apparatus according to claim 1 and an external computer capable of storing measured data collected by the waveform observing apparatus and displaying the measured data in waveform, wherein,
   along with the measured data collected by the waveform observing apparatus from the waveform observing apparatus, the simple indication, the first handwritten comment image information and second image information associated with the first handwritten comment image information are stored from the waveform observing apparatus into a memory of the external computer,
   the simple indication is displayed in the vicinity of a waveform portion added with the first handwritten comment, along with the waveform display of the measured data, in the external computer, and
   by the user selecting the simple indication, based upon the second image information, an image of a partial waveform in the vicinity of the first handwritten comment is displayed in the external computer, along with the first handwritten comment.

5. The waveform observing system according to claim 4, wherein
   a historical log of the first handwritten comment is stored into the memory of the external computer, and
   the system further has:
   a historical log displaying device, which displays a historical log list of the handwritten comments in the external computer when the user selects the simple indication; and
   a second image information displaying device which, when the user selects a desired log from the historical log list displayed in the external computer, reads second image information of the log and displays a second handwritten comment included in the second image information and the image of the partial waveform in the vicinity of the second handwritten comment in the external computer.

6. The waveform observing apparatus according to claim 1, wherein the simple indication is a letter string.

7. The waveform observing apparatus according to claim 1, wherein
the simple indication is shown on the display section as a quadrilateral shape.

8. A waveform observing apparatus, comprising a touch panel in a display section and allowing a handwritten comment to be written in a desired place of a displayed waveform by use of the touch panel, the apparatus including:
a first image information generating device for generating first handwritten comment image information which includes a compression ratio of a waveform display at the time of writing a first handwritten comment by use of the touch panel, along with first image information of the first handwritten comment;
a simple indication registering device for registering a simple indication for displaying the simple indication corresponding to the first handwritten comment;
a memory device for storing the first handwritten comment image information and the registered simple indication;
a compression ratio setting device for setting a compression ratio of the waveform display of the waveform observing apparatus; and
a control device, which
calls up the first handwritten comment image information of the first handwritten comment from the memory device and displays the first image information on the displayed waveform having a time-axial position where the first handwritten comment should be displayed in the display section of the waveform observing apparatus on the occasion when the waveform is displayed in determination of the compression ratio set by the compression ratio setting device to be the same as the compression ratio at the time of writing the handwritten comment from the waveform on display in the waveform observing apparatus at the time of displaying the image, and
calls up the simple indication corresponding to the first handwritten comment from the memory device and displays on the waveform having a time-axial position where the first handwritten comment should be displayed in the display section of the waveform observing apparatus on the occasion when the waveform is displayed in determination of the compression ratio set by the compression ratio setting device to be different from the compression ratio at the time of writing the first handwritten comment and not within the allowable range for displacement of the image of the first handwritten comment from the waveform on display in the waveform observing apparatus at the time of displaying the image, or
calls up the first handwritten comment image information of the first handwritten comment from the memory device and displays the first image information on the displayed waveform having a time-axial position where the first handwritten comment should be displayed in the display section of the waveform observing apparatus on the occasion when the waveform is displayed in determination of the compression ratio set by the compression ratio setting device to be different from the compression ratio at the time of writing the first handwritten comment but within the allowable range for displacement of the image of the first handwritten comment from the waveform on display in the waveform observing apparatus at the time of displaying the image.

9. The waveform observing apparatus according to claim 8, wherein the simple indication is configured to indicate a presence of handwritten comments.

10. The waveform observing apparatus according to claim 9, wherein
the simple indication is displayed in the time axial portion where the first handwritten comment should be displayed in the display section of the waveform observing apparatus.

11. The waveform observing apparatus according to claim 8, wherein
the control device is configured to display the simple indication in a position associated with where the first handwritten comment should be displayed in the display section.

12. The waveform observing apparatus according to claim 8, wherein
the control device is configured to display the simple indication for a user so as to be aware of the presence of handwritten comments.

13. The waveform observing apparatus according to claim 8, wherein the simple indication is a letter string.

14. The waveform observing apparatus according to claim 8, wherein
the simple indication is displayed in the time axial portion where the first handwritten comment should be displayed in the display section of the waveform observing apparatus.

15. The waveform observing apparatus according to claim 8, wherein
the simple indication is displayed in the time axial portion where the handwritten comment should be displayed in the display section of the waveform observing apparatus.

16. The waveform observing apparatus according to claim 15, wherein
the simple indication is shown on the display section as a quadrilateral shape.

17. The waveform observing apparatus according to claim 8, wherein
the simple indication is shown on the display section as a quadrilateral shape.

18. The waveform observing apparatus according to claim 8, further having
a second image information generating device for generating second image information with a background which includes a second handwritten comment written by use of the touch panel and a partial waveform in the vicinity of the second handwritten comment, wherein
the second image information is stored into the memory device in association with the first handwritten comment image information, and
when the simple indication is called up from the memory device, the second image information is read, and an image of the second handwritten comment including the partial waveform is displayed in the display section of the waveform observing apparatus, along with the waveform on display in the waveform observing apparatus.

* * * * *